(12) United States Patent
Masuoka et al.

(10) Patent No.: US 8,138,048 B2
(45) Date of Patent: Mar. 20, 2012

(54) SEMICONDUCTOR STORAGE DEVICE

(75) Inventors: Fujio Masuoka, Chuo-ku (JP); Shintaro Arai, Chuo-ku (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 178 days.

(21) Appl. No.: 12/704,012

(22) Filed: Feb. 11, 2010

(65) Prior Publication Data

US 2010/0203714 A1    Aug. 12, 2010

Related U.S. Application Data

(63) Continuation of application No. PCT/JP2009/061293, filed on Jun. 22, 2009.

(60) Provisional application No. 61/207,553, filed on Feb. 13, 2009.

(30) Foreign Application Priority Data

Jun. 20, 2008    (WO) .................. PCT/JP2008/061308

(51) Int. Cl.
*H01L 21/336* (2006.01)
(52) U.S. Cl. ................... 438/268; 438/156; 257/E21.41
(58) Field of Classification Search .................. 438/137, 438/156, 173, 192, 206, 212, 268
See application file for complete search history.

(56) References Cited

U.S. PATENT DOCUMENTS 5,969,384 A * 10/1999 Hong ............................ 257/322
6,015,725 A *  1/2000 Hirayama .................... 438/156
(Continued)

FOREIGN PATENT DOCUMENTS

JP    02-188966 A    7/1990
(Continued)

OTHER PUBLICATIONS

International Search Report for International Application No. PCT/JP2008/061308, dated Sep. 16, 2008, 1 page.

(Continued)

*Primary Examiner* — Charles Garber
*Assistant Examiner* — Reema Patel
(74) *Attorney, Agent, or Firm* — Brinks Hofer Gilson & Lione

(57) ABSTRACT

It is intended to provide a semiconductor device having a reduced thickness of a silicon nitride film on an outer periphery of a gate electrode of an SGT. A semiconductor device of the present invention is constructed using a MOS transistor which has a structure where a drain, a gate and a source are arranged in a vertical direction with respect to a substrate, and the gate is formed to surround a pillar-shaped semiconductor layer. The semiconductor device comprises: a silicide layer formed in an upper surface of each of upper and lower diffusion layers formed in upper and underneath portions of the pillar-shaped semiconductor layer, in a self-alignment manner, wherein the silicide layer is formed after forming a first dielectric film on a sidewall of the pillar-shaped semiconductor layer to protect the sidewall of the pillar-shaped semiconductor layer during formation of the silicide layer; and a second dielectric film formed, after forming the silicide layer and then removing the first dielectric film, in such a manner as to cover a source/drain region formed in the underneath portion of the pillar-shaped semiconductor layer, the gate electrode formed on the sidewall of the pillar-shaped semiconductor layer, and a source/drain region formed on the upper portion of the pillar-shaped semiconductor layer.

4 Claims, 39 Drawing Sheets

(a)

(b)

U.S. PATENT DOCUMENTS

| | | | | |
|---|---|---|---|---|
| 6,077,745 A | * | 6/2000 | Burns et al. | 438/270 |
| 6,670,230 B2 | * | 12/2003 | Hsieh | 438/206 |
| 6,821,834 B2 | * | 11/2004 | Ando | 438/212 |
| 2003/0075758 A1 | | 4/2003 | Sundaresan et al. | |
| 2007/0082448 A1 | * | 4/2007 | Kim et al. | 438/268 |
| 2009/0057755 A1 | * | 3/2009 | Dyer et al. | 257/329 |

FOREIGN PATENT DOCUMENTS

| | | |
|---|---|---|
| JP | 05-206407 A | 8/1993 |
| JP | 2002-299613 A | 10/2002 |
| JP | 2003-179160 A | 6/2003 |

OTHER PUBLICATIONS

International Search Report for International Application No. PCT/JP2009/061293, dated Sep. 15, 2009, 1 page.

Written Opinion of the International Searching Authority for International Application No. PCT/JP2008/061308, dated Sep. 16, 2008, 3 pages.

Written Opinion of the International Searching Authority for International Application No. PCT/JP2009/061293, dated Sep. 15, 2009, 3 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

US 8,138,048 B2

SEMICONDUCTOR STORAGE DEVICE

RELATED APPLICATIONS

Pursuant to 35 U.S.C. §119(e), this application claims the benefit of the filing date of Provisional U.S. Patent Application Ser. No. 61/207,553 filed on Feb. 13, 2009. This application is a continuation application of PCT/JP2009/061293 filed on Jun. 22, 2009 which claims priority under 35 U.S.C. §365(a) to PCT/JP2008/061308 filed on Jun. 20, 2008. The entire contents of these applications are hereby incorporated by reference.

TECHNICAL FIELD

The present invention relates to a semiconductor device and a production method therefor, and more particularly to a structure and a production method for an SGT (Surrounding Gate Transistor) which is a vertical MOS transistor comprising a pillar-shaped semiconductor layer having a sidewall serving as a channel region, and a gate electrode formed to surround the channel region.

BACKGROUND ART

With a view to achieving higher integration and higher performance of an LSI circuit, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see, for example, Patent Document 1: JP 2-188966A). In the SGT, a drain, a gate and a source are arranged in a vertical direction, so that an occupancy area can be significantly reduced as compared with a conventional planar transistor.

FIGS. 37($a$) and 37($b$) are, respectively, a bird's-eye view and a sectional view showing an SGT disclosed in the Patent Document 1. With reference to FIGS. 37($a$) and 37($b$), a structure of the SGT will be described. A pillar-shaped silicon layer 501 is formed on a silicon substrate. A gate dielectric film 502 is formed to surround the pillar-shaped silicon layer 501, and a gate electrode 503 is formed to surround the gate dielectric film 502. A sidewall of the pillar-shaped silicon layer 501 surrounded by the gate electrode serves as a channel of a transistor. A lower diffusion layer 504 and an upper diffusion layer 505 each serving as a source/drain region are formed, respectively, in underneath and upper portions of the pillar-shaped silicon layer 501. The upper diffusion layer 505 is connected to an interconnection layer via a contact.

Patent Document 1: JP 2-188966A

In cases where the SGT illustrated in FIG. 37 as disclosed in the Patent Document 1 is applied to a highly-integrated and high-performance logic device, such as CPU, it is necessary to form a silicide layer in the source/drain region in a self-alignment manner to reduce a parasitic resistance of the source/drain region so as to improve transistor performance. In addition, it is critical to improve the transistor performance without increasing an occupancy area of the SGT.

In view of the above circumstances, it is an object of the present invention to reduce a film thickness of a silicon nitride film on an outer periphery of a gate electrode of an SGT to reduce an occupancy area of the SGT, and an occupancy area of a circuit formed using the SGT, particularly a circuit where the SGT and a contact are arranged with a minimum distance therebetween, such as an SRAM.

SUMMARY OF THE INVENTION

In order to achieve the above object, the present invention has the following features. According to a first aspect of the present invention, there is provided a semiconductor device constructed using a MOS transistor which has a structure where a drain, a gate and a source are arranged in a vertical direction with respect to a substrate, and the gate is formed to surround a pillar-shaped semiconductor layer. The semiconductor device comprises: a silicide layer formed in an upper surface of each of upper and lower diffusion layers formed in upper and underneath portions of the pillar-shaped semiconductor layer, in a self-alignment manner, wherein the silicide layer is formed after forming a first dielectric film on a sidewall of the pillar-shaped semiconductor layer to protect the sidewall of the pillar-shaped semiconductor layer during formation of the silicide layer; a second dielectric film formed, after forming the silicide layer and then removing the first dielectric film, in such a manner as to cover a source/drain region formed in the underneath portion of the pillar-shaped semiconductor layer, the gate electrode formed on the sidewall of the pillar-shaped semiconductor layer, and a source/drain region formed on the upper portion of the pillar-shaped semiconductor layer; and a third dielectric film covering the second dielectric film to serve as an interlayer film.

Preferably, the semiconductor device of the present invention has a configuration satisfying the following relation: $0.8\,Tt < Ts < 1.2\,Tt$, wherein Ts is a thickness of a first portion of the second dielectric film which covers a part of the sidewall of the pillar-shaped semiconductor layer and the gate electrode, and Tt is a thickness of a second portion of the second dielectric film which covers the upper and underneath portions of the pillar-shaped silicon layer.

More preferably, the semiconductor device of the present invention has a configuration satisfying the following relation: $0.5\,Tt < Ts < 1.0\,Tt$, wherein Ts is a thickness of a first portion of the second dielectric film which covers a part of the sidewall of the pillar-shaped semiconductor layer and the gate electrode, and Tt is a thickness of a second portion of the second dielectric film which covers the upper and underneath portions of the pillar-shaped silicon layer.

Particularly preferably, the semiconductor device of the present invention has a configuration satisfying the following relation: $0.25\,Tt < Ts < 0.5\,Tt$, wherein Ts is a thickness of a first portion of the second dielectric film which covers a part of the sidewall of the pillar-shaped semiconductor layer and the gate electrode, and Tt is a thickness of a second portion of the second dielectric film which covers the upper and underneath portions of the pillar-shaped silicon layer.

Preferably, in the semiconductor device of the present invention, the second dielectric film is a silicon nitride film, and the third dielectric film is a silicon oxide film.

According to a second aspect of the present invention, there is provided a method of producing a semiconductor device constructed using a MOS transistor which has a structure where a drain, a gate and a source are arranged in a vertical direction, and the gate is formed to surround a pillar-shaped semiconductor layer. The method comprises the steps of: etching a silicon substrate to form a pillar-shaped semiconductor layer; forming a gate dielectric film on a surface of diffusion layers for source/drain regions to be formed in an upper portion and an underneath portion of the pillar-shaped semiconductor layer, and a surface of a sidewall of the pillar-shaped semiconductor layer; forming a gate conductive film on a surface of the gate dielectric film; etching each of the gate dielectric film and the gate conductive film to form a gate electrode; forming a first dielectric film on the sidewall of the pillar-shaped semiconductor layer to protect the sidewall of the pillar-shaped semiconductor layer when a silicide layer is formed in an upper surface of each of the diffusion layers formed in the upper and underneath portions of the pillar-shaped semiconductor layer, in a self-alignment manner; forming a silicide layer in the upper surface of each of the diffusion layers formed in the upper and underneath portions of the pillar-shaped semiconductor layer, in a self-alignment manner; after completion of the formation of the silicide layer, removing the first dielectric film; forming a second dielectric film on the pillar-shaped semiconductor layer and the gate electrode to serve as a contact stopper; and forming a third dielectric film on the second dielectric film to serve as an interlayer film.

Preferably, in the method of the present invention, each of the first and second dielectric films is a silicon nitride film, and the third dielectric film is a silicon oxide film.

BRIEF DESCRIPTION OF THE DRAWINGS

FIGS. 11(a) to 11(d) comparatively show the SGT according to the first embodiment and a conventional SGT, wherein FIGS. 11(a) and 11(c) are top plan views, and FIGS. 11(b) and 11(d) are sectional views.

DETAILED DESCRIPTION OF THE PREFERRED EMBODIMENTS

The present invention will now be described based on an embodiment thereof.

First Embodiment

Figure 1:
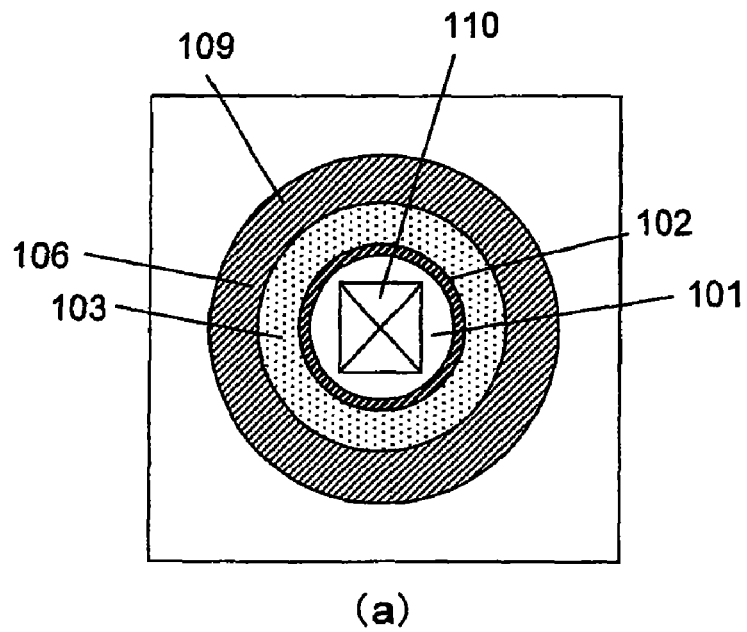
FIGS. 1(a) and 1(b) are, respectively, a top plan view and a sectional view showing an SGT according to a first embodiment of the present invention.
Figure 1:
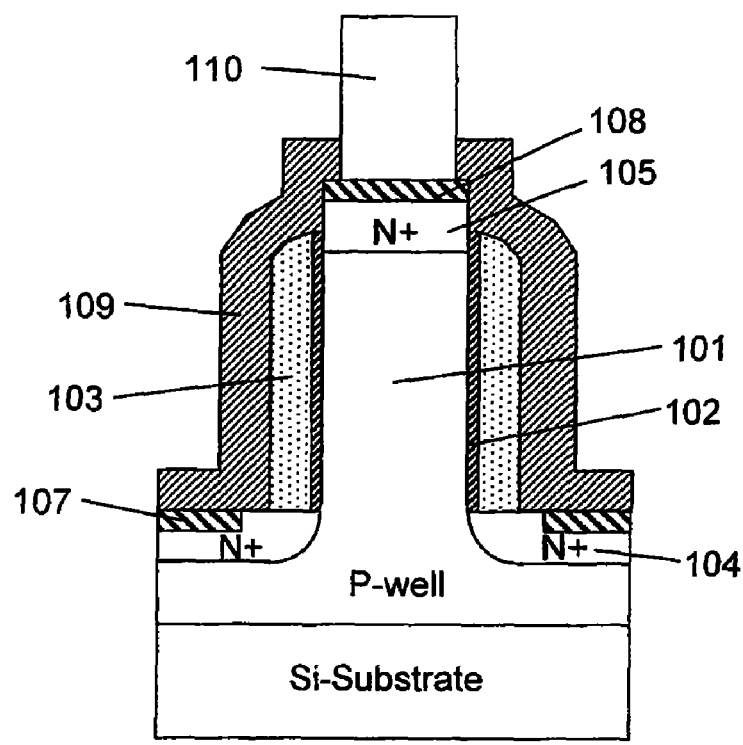

FIGS. 1(a) and 1(b) are, respectively, a top plan view and a sectional view showing an SGT according to a first embodiment of the present invention. With reference to FIGS. 1(a) and 1(b), a structure of the SGT will be described below. A pillar-shaped semiconductor layer 101 is formed on a silicon substrate. A gate dielectric film 102 is formed to surround the pillar-shaped semiconductor layer 101, and a gate electrode 103 is formed to surround the gate dielectric film 102. A sidewall of the pillar-shaped semiconductor layer 101 surrounded by the gate electrode serves as a channel region of a transistor. A lower diffusion layer 104 and an upper diffusion layer 105 each serving as a source/drain region are formed, respectively, in underneath and upper portions of the pillar-shaped semiconductor layer 101. A silicide layer 107 is formed in an upper surface of the lower diffusion layer, and a silicide layer 108 is formed in an upper surface of the upper diffusion layer. A nitride film 109 serving as a contact stopper (contact-stopper nitride film 109) is formed to cover the pillar-shaped semiconductor layer and the gate electrode, and the upper diffusion layer 105 is connected to a contact 110.

In the SGT according to the first embodiment, a spacer comprised of a nitride film or the like required for covering the gate electrode during the silicide formation is removed, and the gate electrode is covered by only the contact-stopper nitride film 109, so that an area per SGT is minimized.

A production method for forming the SGT according to the first embodiment will be described below.

Figure 2:
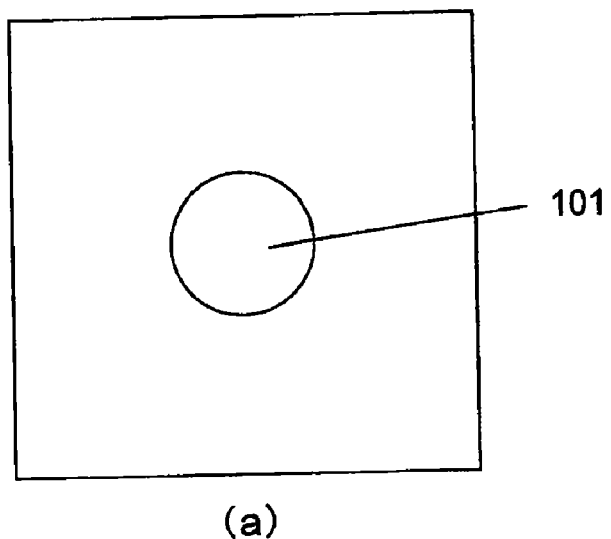
FIGS. 2(a) and 2(b) are process diagrams showing a production process of the SGT according to the first embodiment, on a step-by-step basis.
Figure 2:
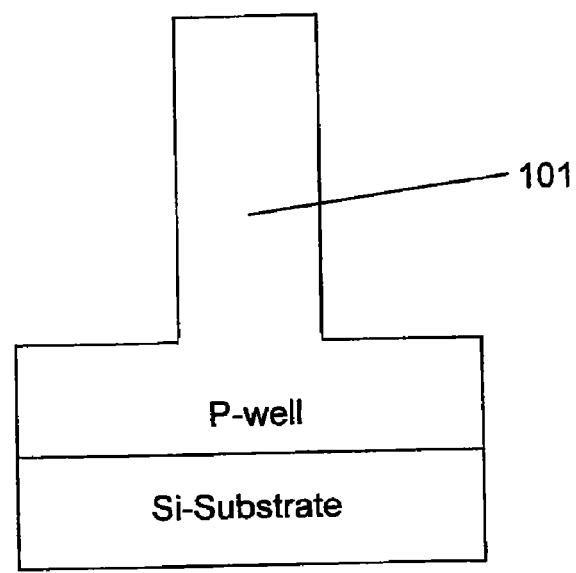

As shown in FIGS. 2(a) and 2(b), a silicon substrate is etched to form a pillar-shaped semiconductor layer 101.

Figure 3:
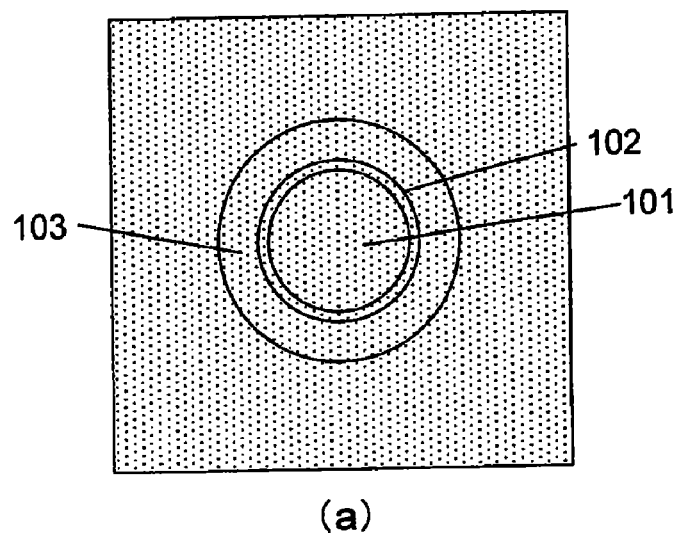
FIGS. 3(a) and 3(b) are process diagrams showing the production process of the SGT according to the first embodiment, on a step-by-step basis.
Figure 3:
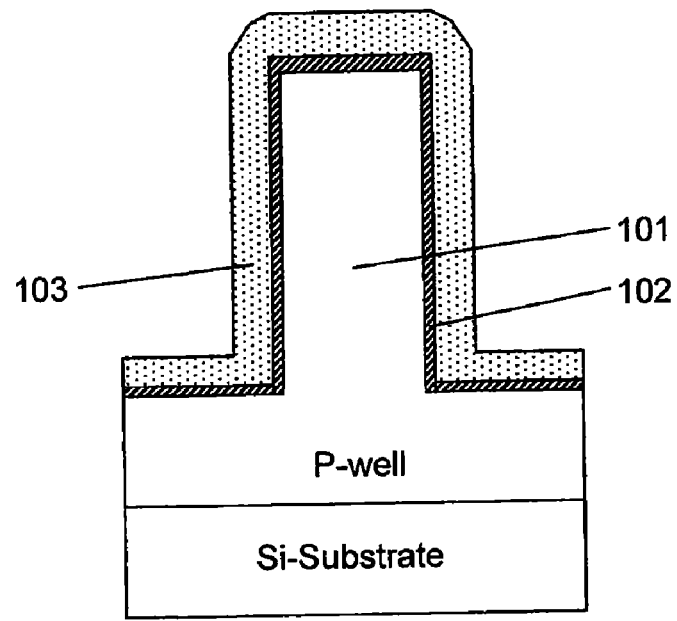

As shown in FIGS. 3(a) and 3(b), a gate dielectric film 102 and a gate conductive film 103 are formed.

Figure 4:
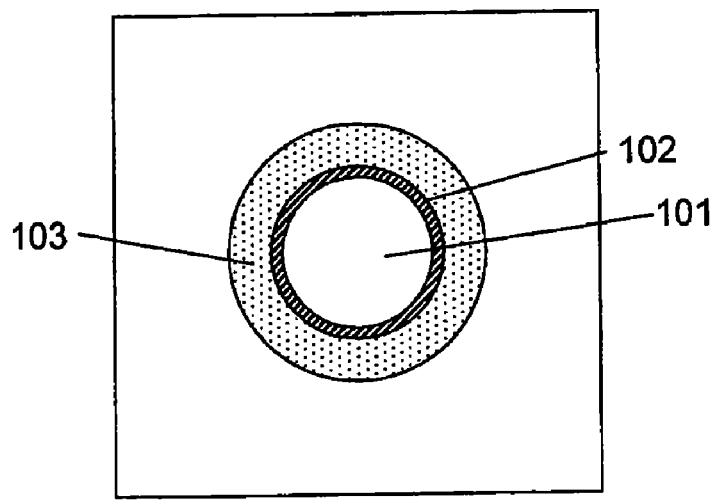
FIGS. 4(a) and 4(b) are process diagrams showing the production process of the SGT according to the first embodiment, on a step-by-step basis.
Figure 4:
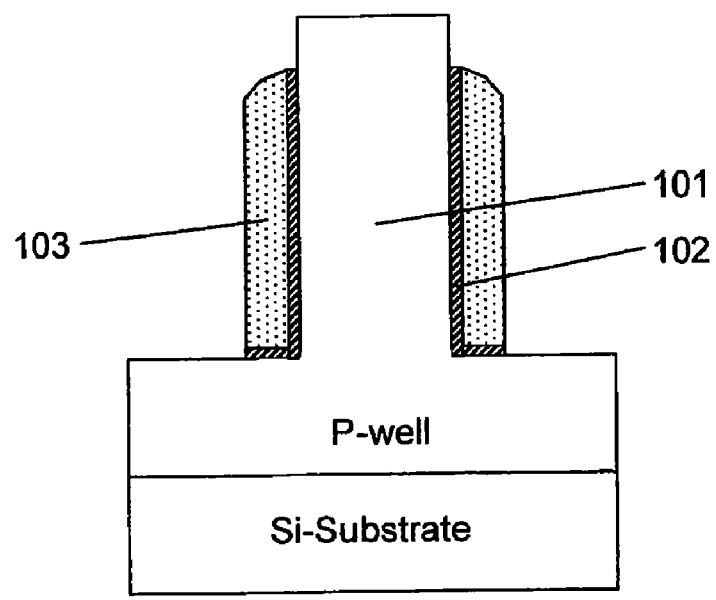

As shown in FIGS. 4(a) and 4(b), after forming the gate conductive film on a surface of the gate dielectric film, the gate dielectric film and the gate conductive film are etched to form a gate electrode 103.

Figure 5:
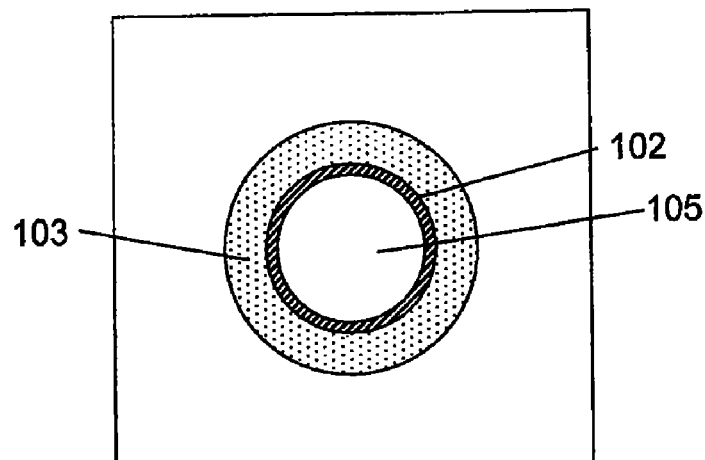
FIGS. 5(a) and 5(b) are process diagrams showing the production process of the SGT according to the first embodiment, on a step-by-step basis.
Figure 5:
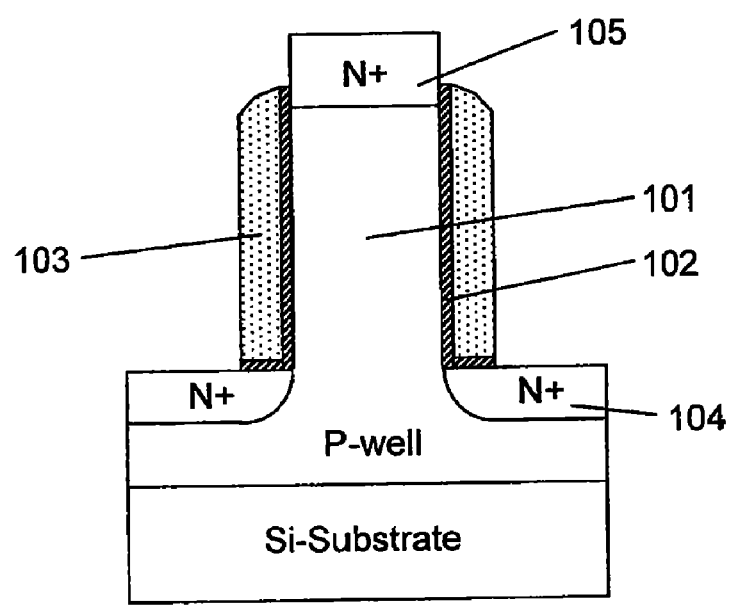

As shown in FIGS. 5(a) and 5(b), a lower diffusion layer 104 and an upper diffusion layer 105 are formed by ion implantation.

Figure 6:
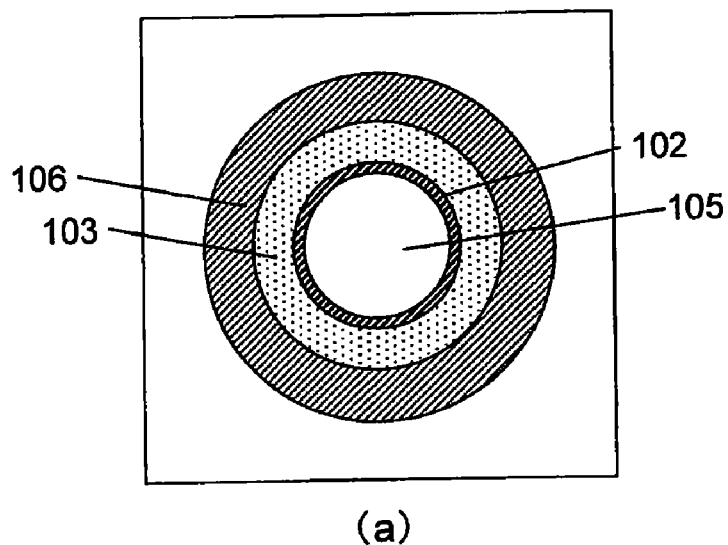
FIGS. 6(a) and 6(b) are process diagrams showing the production process of the SGT according to the first embodiment, on a step-by-step basis.
Figure 6:
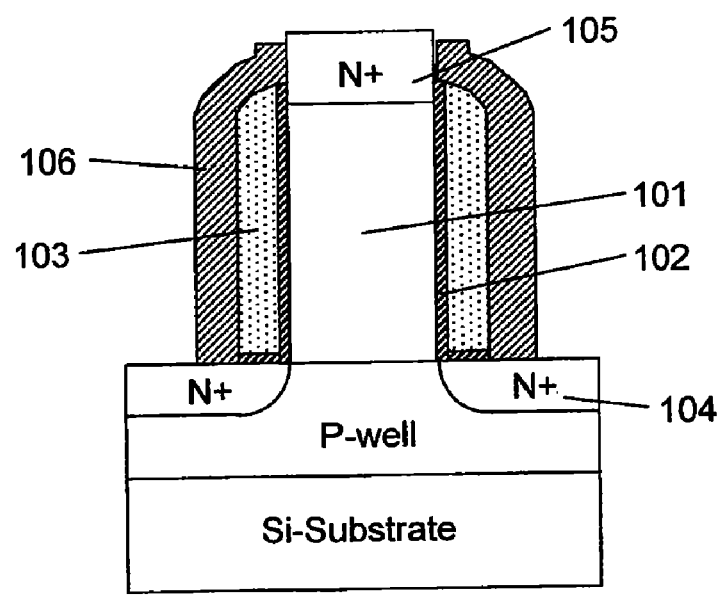

As shown in FIGS. 6(a) and 6(b), a silicon nitride film is formed, and etched back. The resulting silicon nitride film 106 covering the gate electrode and a sidewall of the pillar-shaped semiconductor layer allows silicide to be formed in an upper surface of each of the source/drain diffusion layers in a self-alignment manner, which makes it possible to suppress silicide formation from the sidewall of the pillar-shaped semiconductor layer, short-circuiting between the gate electrode and the diffusion layer through silicide, etc.

Preferably, a dielectric film to be formed in this step is a type insoluble in hydrofluoric acid for use in a pretreatment for the silicide formation, such as a silicon nitride film.

Figure 7:
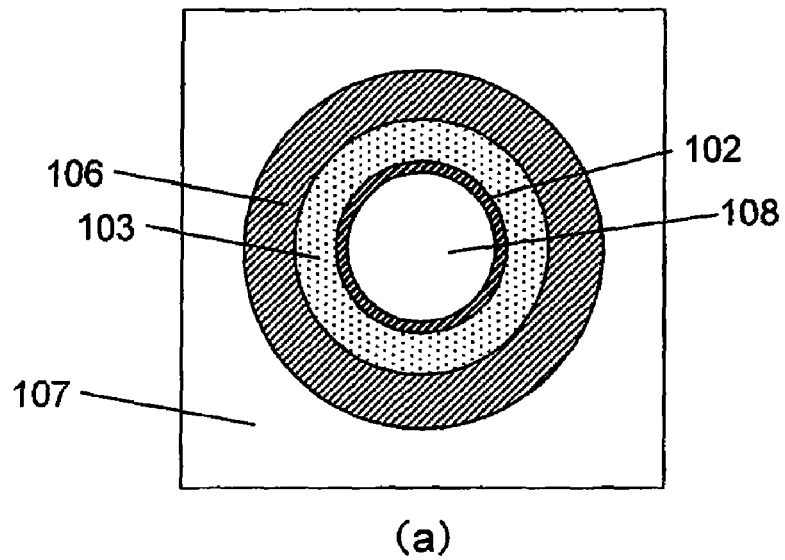
FIGS. 7(a) and 7(b) are process diagrams showing the production process of the SGT according to the first embodiment, on a step-by-step basis.
Figure 7:
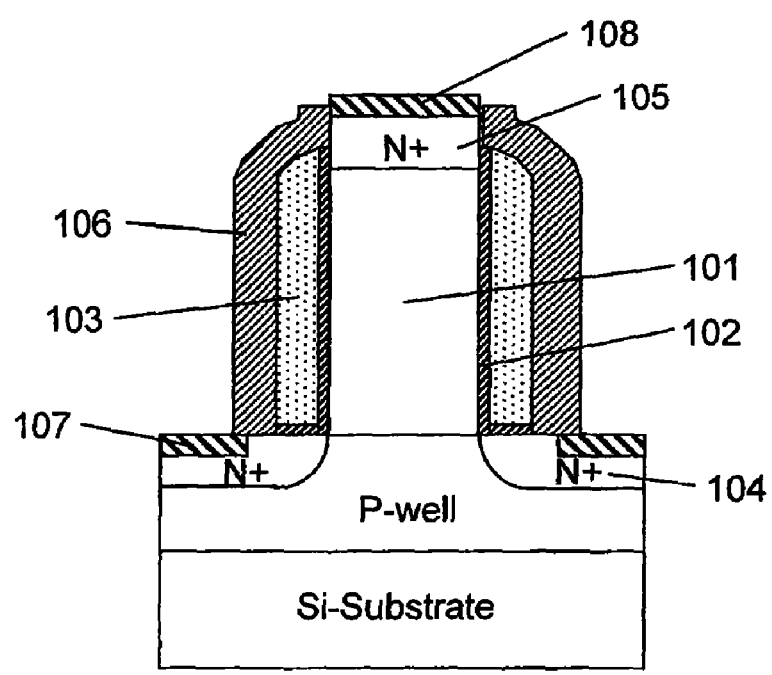

As shown in FIGS. 7(a) and 7(b), a metal, such as cobalt (Co) or nickel (Ni), is sputtered onto the upper surface of each of the source/drain diffusion layers. Then, the sputtered surface is subjected to a heat treatment, and an unreacted metal is removed. In this manner, a silicide layer (107, 108) is formed only in the upper surface of each of the lower diffusion layer 104 and the upper diffusion layer 105.

Figure 8:
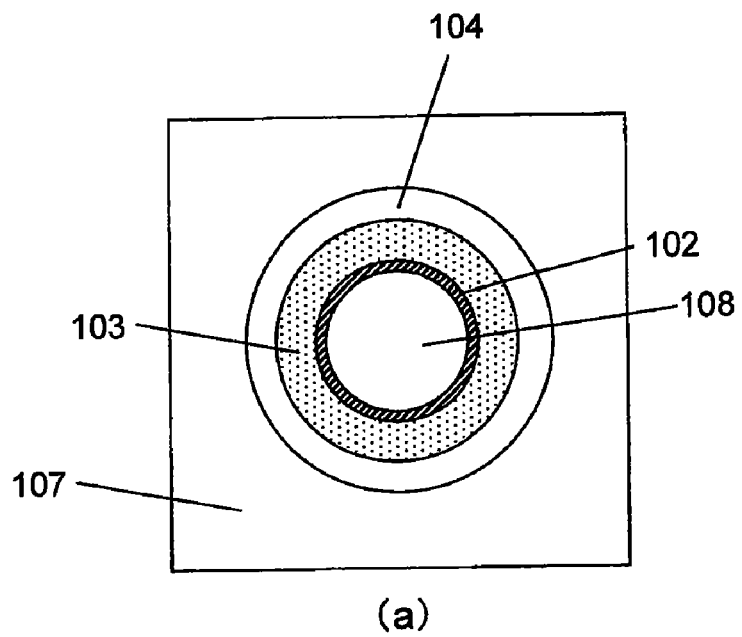
FIGS. 8(a) and 8(b) are process diagrams showing the production process of the SGT according to the first embodiment, on a step-by-step basis.
Figure 8:
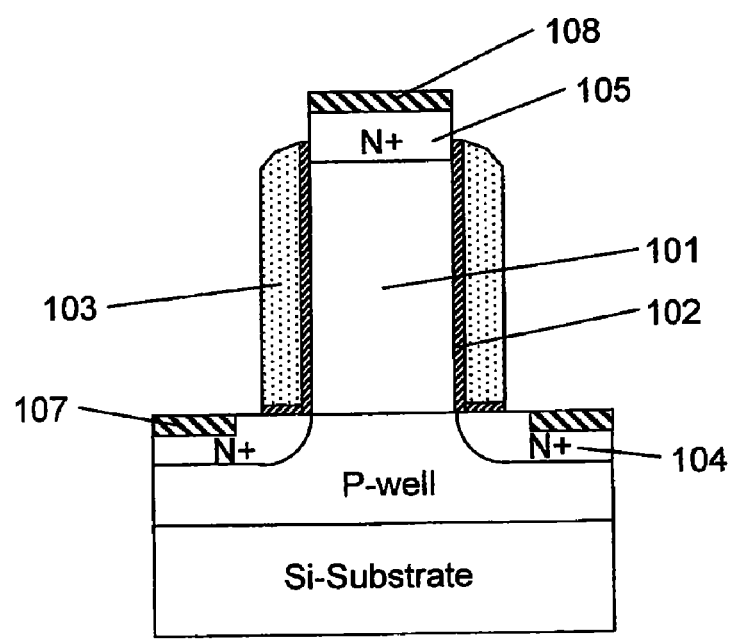

As shown in FIGS. 8(a) and 8(b), the silicon nitride film-based spacer 106 formed before the silicide formation is removed by wet etching. In this step, the silicon nitride film-based spacer 106 formed on the gate electrode is removed, which makes it possible to reduce an occupancy area of an SGT to be obtained.

Figure 9:
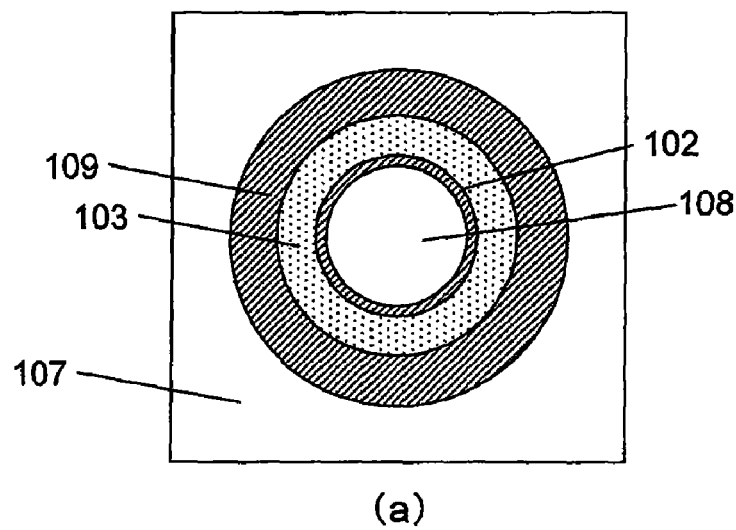
FIGS. 9(a) and 9(b) are process diagrams showing the production process of the SGT according to the first embodiment, on a step-by-step basis.
Figure 9:
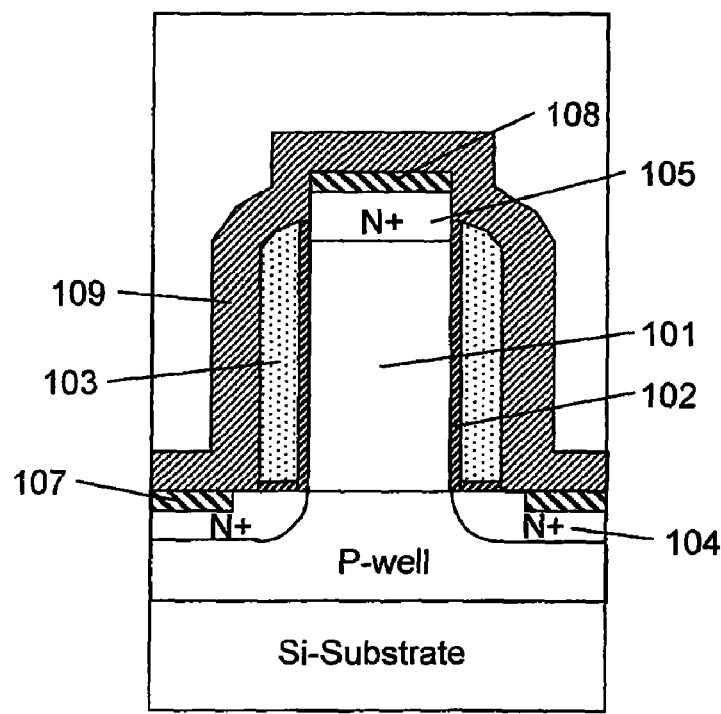

As shown in FIGS. 9(a) and 9(b), a contact-stopper silicon nitride film 109 is formed. Subsequently, a silicon oxide film is formed to serve as an interlayer film.

Figure 10:
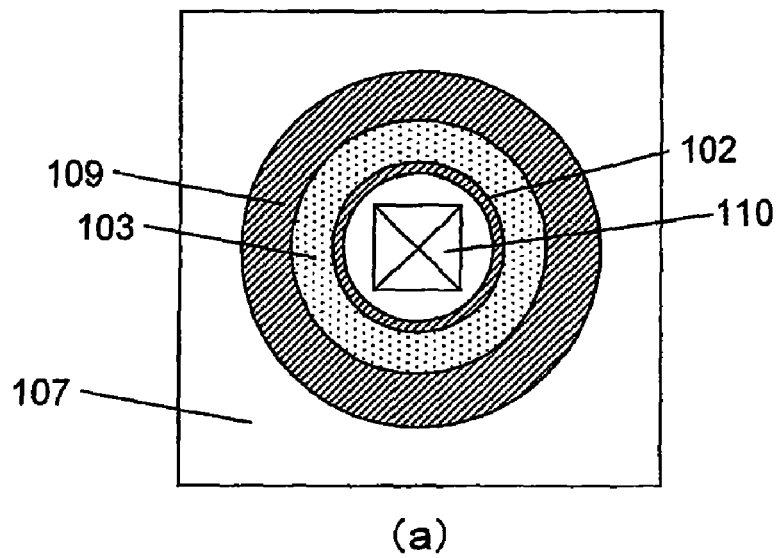
FIGS. 10(a) and 10(b) are process diagrams showing the production process of the SGT according to the first embodiment, on a step-by-step basis.
Figure 10:
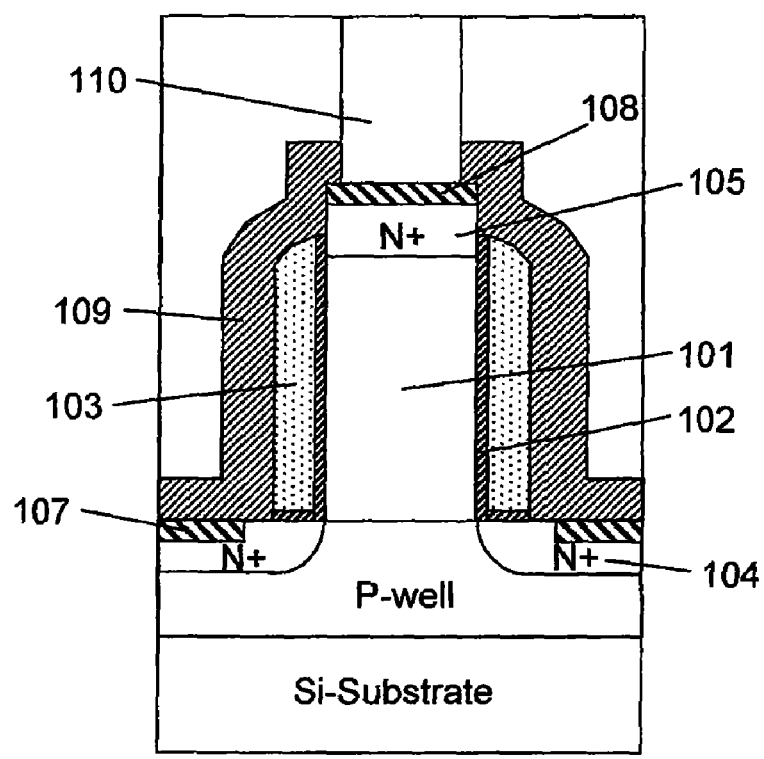

As shown in FIGS. 10(a) and 10(b), a contact 110 is formed.

As described in connection with the above production process, a feature of the first embodiment is in that, after forming a silicide layer in an upper surface of each of source/drain diffusion layers, a silicon nitride film-based spacer formed on a gate electrode is removed, whereby an SGT occupancy area can be reduced, and a distance between adjacent SGTs and a distance between an SGT and a contact can be reduced. Differently from a production process of a planar transistor, in a conventional SGT, after forming a gate, a dielectric film is formed to cover the gate, wherein a film thickness of the dielectric film has a direct impact on an increase in SGT occupancy area and thus an increase in circuit occupancy area. With a focus on this point, the SGT according to the first embodiment is designed such that a dielectric film to be finally formed on an outer periphery of a gate electrode is limited to only a contact-stopper silicon nitride film.

Figure 11:
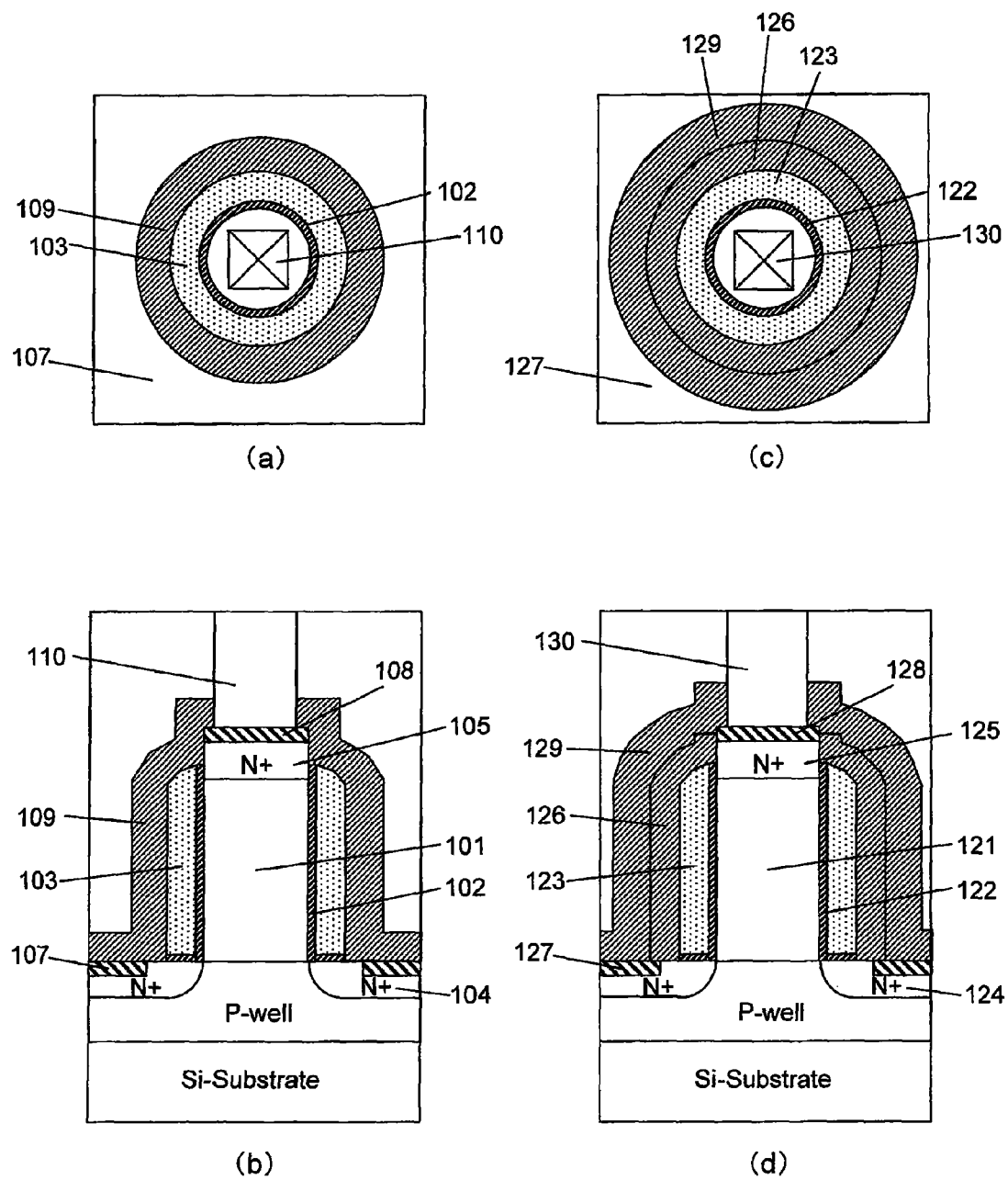

FIGS. 11(a) and 11(b) are, respectively, a top plan view and a sectional view showing the SGT according to the first embodiment, and FIGS. 11(c) and 11(d) are, respectively, a top plan view and a sectional view showing a conventional SGT. In the conventional SGT, a nitride film-based spacer 126 exists inside a contact-stopper silicon nitride film 129 without being removed. This causes an increase in SGT occupancy area.

For example, given that a film thickness of the nitride film-based spacer 126 is 30 nm, based on the first embodiment, a distance between an SGT and a contact can be reduced by 30 nm. Generally, with a view to reducing an area of a logic circuit section, each of a large number of contacts is arranged with a minimum distance relative to an SGT. Thus, based on the first embodiment, a logic circuit area can be effectively reduced.

Second Embodiment

A second embodiment of the present invention shows one example where a formation method and a structure for a contact-stopper nitride film are adjusted to reduce an SGT occupancy area.

Figure 12:
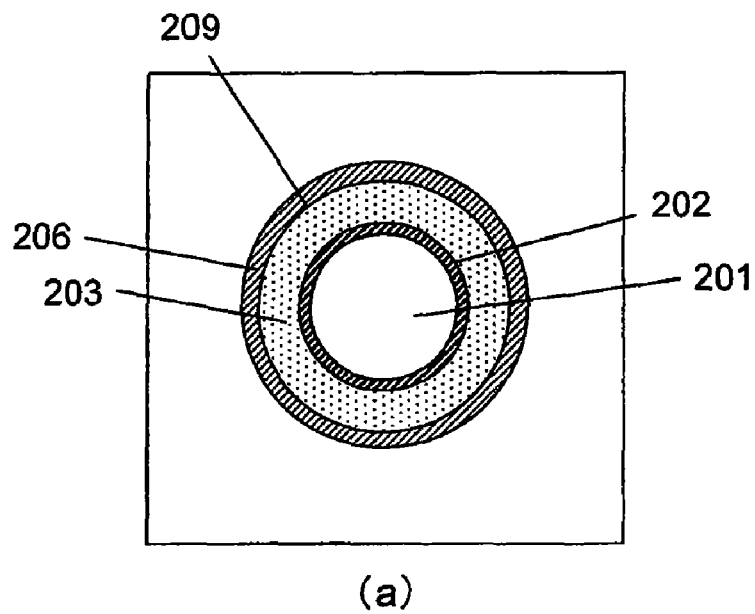
FIGS. 12(a) and 12(b) are, respectively, a top plan view and a sectional view showing an SGT according to a second embodiment of the present invention.
Figure 12:
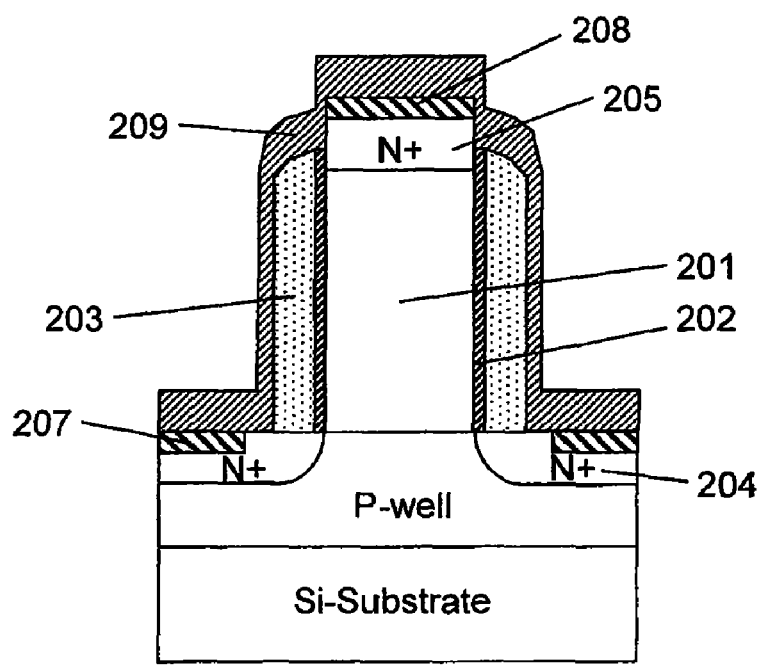

FIGS. 12(a) and 12(b) are, respectively, a top plan view and a sectional view showing an SGT according to the second embodiment. The second embodiment is different from the first embodiment, in that a contact-stopper nitride film in the second embodiment is formed in a configuration where a portion of the nitride film formed on a top surface of a pillar-shaped semiconductor layer and an upper surface of a lower diffusion layer to actually serve as a contact stopper has a film thickness greater than that of a portion of the nitride film formed on a gate electrode. The contact-stopper nitride film formed in the above configuration can function as a contact stopper without causing an increase in SGT occupancy area.

In a conventional planar transistor, it is often the case that a contact-stopper nitride film is formed under film formation conditions providing high coverage. However, in an SGT, the use of a high-coverage film causes a problem of an increase in area in a lateral or horizontal direction. In the second embodiment, a film thickness of the nitride film to be formed in a vertical direction can be sufficiently ensured by reducing a film thickness of the nitride film to be formed in horizontal direction. Such a configuration of the nitride film can be achieved by film formation based on sputtering, film formation based on CVD (chemical vapor deposition) under reaction rate control, or film formation based on a combination of sputtering and CVD.

Generally, a contact-stopper nitride film is formed in a configuration satisfying the following relation: $0.8\,Tt < Ts < 1.2\,Tt$, wherein Ts is a thickness of a portion of the nitride film formed around a gate electrode, and Tt is a thickness of a portion of the nitride film formed on an upper silicide layer. In view of suppressing an increase in SGT occupancy area, it is desirable to adjust conditions for forming the nitride film, so as to allow the nitride film to have a configuration satisfying the following relation: 0.5 Tt<Ts<1.0 Tt. In this case, an increase in SGT occupancy area can be suppressed while maintaining the thickness Tt of the portion of the nitride film on the upper silicide layer. If the nitride film is formed in a configuration satisfying the following relation: 0.25 Tt<Ts<0.5 Tt, an increase in SGT occupancy area can be more effectively suppressed.

Third Embodiment

A third embodiment of the present invention shows one example where the present invention is applied to an SRAM cell to facilitate a quantitative evaluation of an effect thereof. Particularly, in the third embodiment, the effect of the present invention will be shown by taking a CMOS 6T-SRAM using six SGTs formed on an SOI substrate, as an example.

Figure 13:
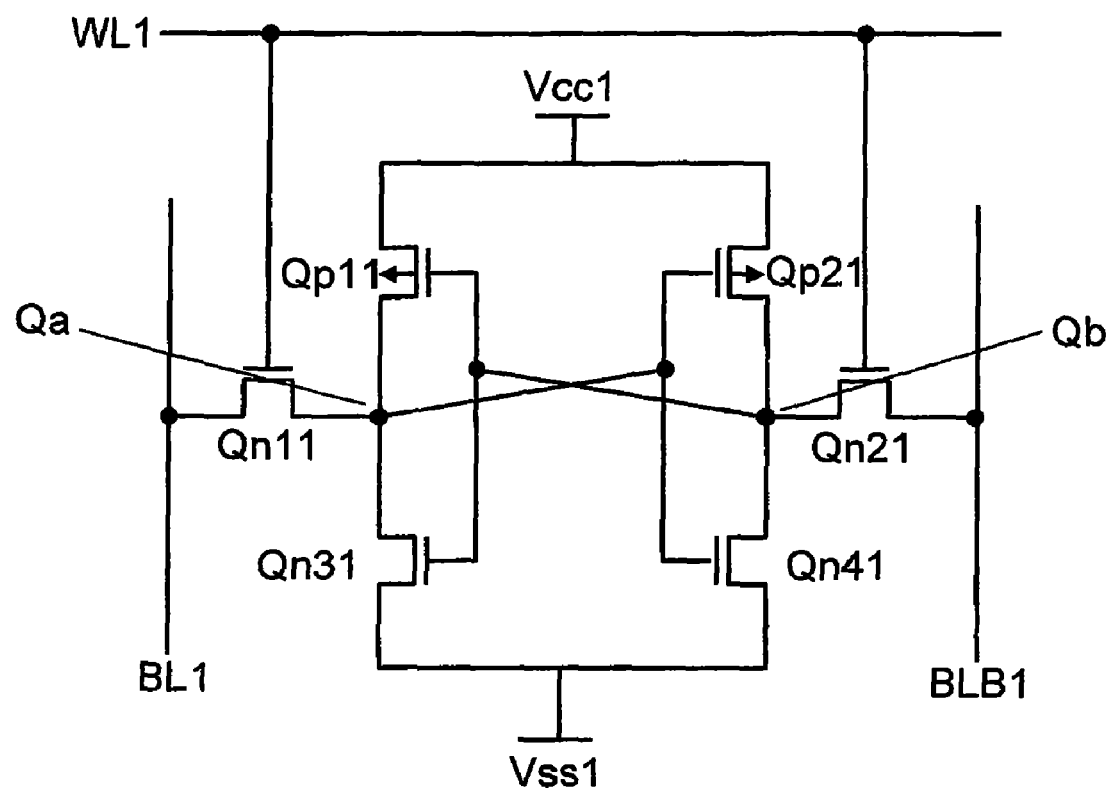
FIG. 13 is a diagram showing an equivalent circuit of a memory cell in an SRAM according to a third embodiment of the present invention.

FIG. 13 illustrates an equivalent circuit of a memory cell in the CMOS 6T-SRAM according to the third embodiment. In FIG. 13, each of BL1 and BLB1 indicates a bit line, and WL1 indicates a word line. Vcc 1 indicates a power source potential, and Vss1 indicates a ground potential. Each of Qn11 and Qn21 indicates an access transistor operable to allow access to the memory cell, and each of Qn31 and Qn41 indicates a driver transistor operable to drive the memory cell. Each of Qp11 and Qp21 indicates a load transistor operable to supply electric charges to the memory cell, and each of Qa and Qb indicates a storage node for storing data.

As one example of an operation of the memory cell in FIG. 13, a reading operation under a condition that data "L" is stored in the storage node Qa, and data "H" is stored in the storage node Qb, will be described below. In the reading operation, each of the bit lines BL1, BLB1 is pre-charged to an "H" potential. After completion of the pre-charge, when the word line WL1 is set to an "H" state, each of the access transistors Qn11, Qn21 is turned on. A potential of the storage node Qb has a value close to the "H" potential, so that the driver transistor Qn31 is turned on, and the potential of the bit line BL1 pre-charged to the "H" level is discharged from the access transistor Qn11 through the storage node Qa and the driver transistor Qn31, to come close to an "L" potential.

Meanwhile, the driver transistor Qn41 is kept in its OFF state, because the storage node Qa has a value close to the "L" potential. Thus, the potential of the bit line BLB1 is not discharged, but kept at a value close to the "H" potential, because electric charges are supplied from the load transistor Qp21. Although not illustrated, a sense amplifier connected to the bit line BL1 is activated just after a difference between the potentials of the bit lines BL1, BLB1 is increased to a level capable of being amplified by the sense amplifier, so that data in the memory cell is amplified and output.

Figure 14A:
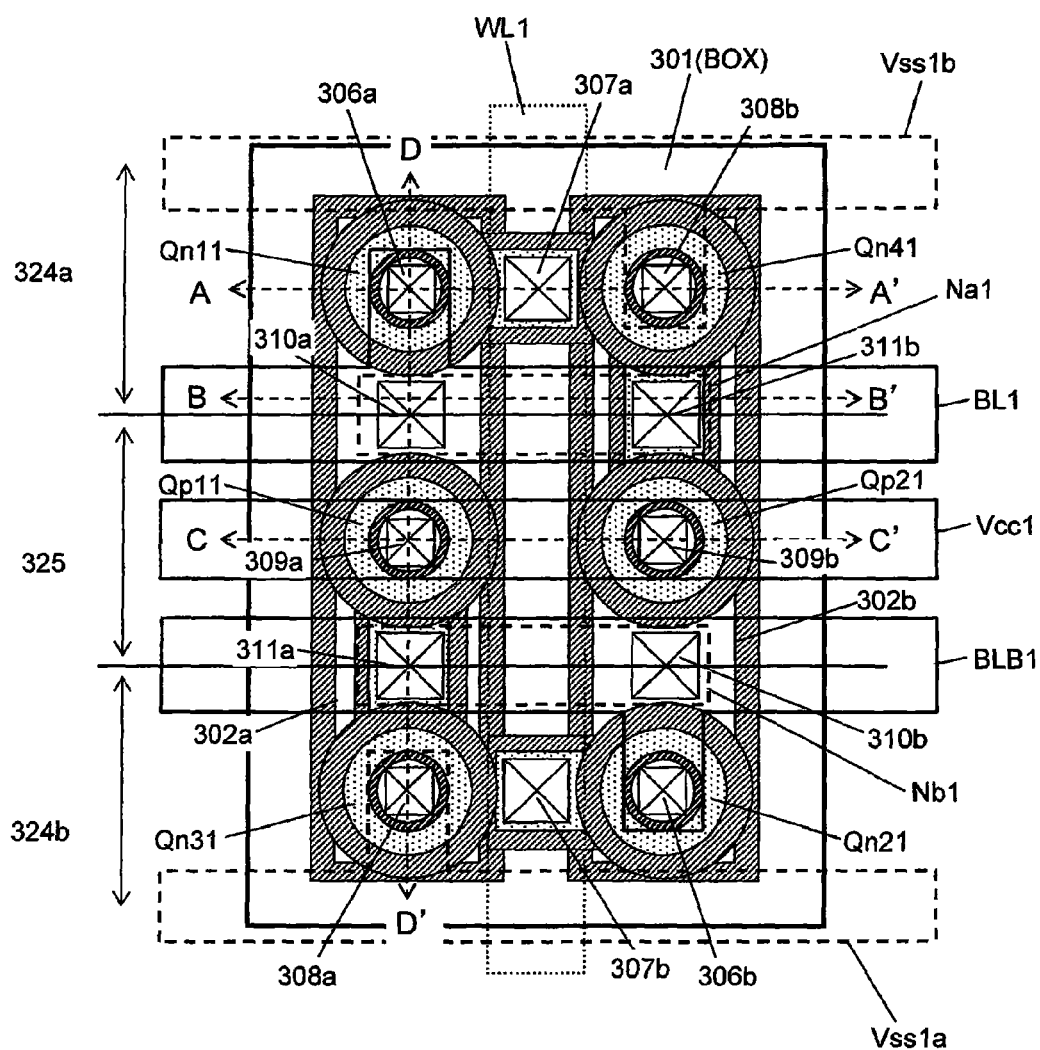
FIGS. 14(a) and 14(b) are top plan views showing the memory cell in the SRAM according to the third embodiment.
Figure 14B:
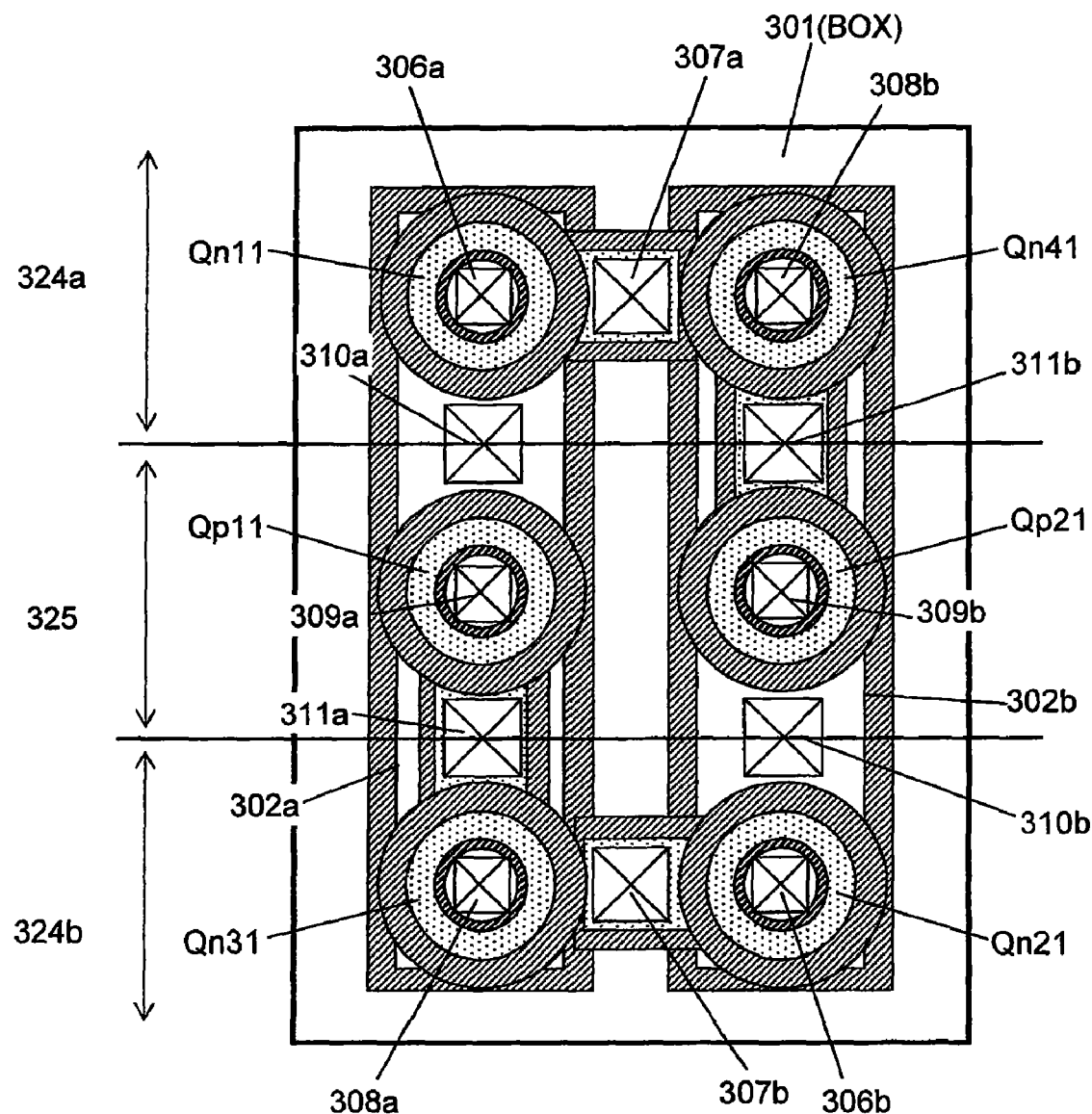

FIGS. 14(a) and 14(b) illustrate a layout of the memory cell in the SRAM according to the third embodiment, wherein FIG. 14(b) shows a state after an interconnection layer is removed from FIG. 14(a), for the purpose of facilitating visual understanding. In an SRAM cell array, a unit cell illustrated in FIG. 14(a) is iteratively arranged. FIGS. 15(a), 15(b), 15(c) and 15(d) are sectional views taken, respectively, along the lines A-A', B-B', C-C' and D-D' in FIG. 14(a).

With reference to FIGS. 14(a) to 15(d), the layout of the memory cell in the SRAM according to the third embodiment will be described below.

A planar silicon layer (302a, 302b) is formed on a buried oxide film layer (BOX) 301. The planar silicon layer (302a, 302b) is formed as an N$^+$ diffusion layer (303a, 303b, 305a, 305b) and a P$^+$ diffusion layer (304a, 304b), by impurity implantation or the like, wherein the N$^+$ and P$^+$ diffusion layers formed in the same planar silicon layer are connected to each other through a silicide layer (313a, 313b) formed in an upper surface of the planar silicon layer (302a, 302b). The planar silicon layer 302a and the planar silicon layer 302b serve as a storage node Qa and a storage node Qb, respectively. In FIGS. 14(a) to 15(d), each of Qn11 and Qn21 indicates an NMOS access transistor operable to allow access to the memory cell, and each of Qn31 and Qn41 indicates an NMOS driver transistor operable to drive the memory cell. Each of Qp11 and Qp21 indicates a PMOS load transistor operable to supply electric charges to the memory cell. A contact 310a formed on the planar silicon layer 302a is connected to a contact 311b formed on a gate line extending from respective gate electrodes of the driver transistor Qn41 and the load transistor Qp21, through a node interconnection line Na1. A contact 310b formed on the planar silicon layer 302b is connected to a contact 311a formed on a gate line extending from respective gate electrodes of the driver transistor Qn31 and the load transistor Qp11, through a node interconnection line Nb1. A contact 306a formed on a top of the access transistor Qn11 is connected to a bit line BL1, and a contact 306b formed on a top of the access transistor Qn21 is connected to a bit line BLB1. Each of a contact 307a formed on a gate line extending from a gate electrode of the access transistor Qn11 and a contact 307b formed on a gate line extending from a gate electrode of the access transistor Qn21 is connected to a word line WL1. A contact (308a, 308b) formed on a top of the driver transistor (Qn31, Qn41) is connected to an interconnection layer (Vss1a, Vss1b) having a ground potential. A contact (309a, 309b) formed on a top of the load transistor (Qp11, Qp21) is connected to an interconnection layer Vcc1 having a power supply potential.

An N$^+$ implantation zone (324a, 324b) and a P$^+$ implantation zone 325 are illustrated in FIGS. 14(a) and 14(b). In the third embodiment, a pattern for defining the N$^+$ implantation zone (324a, 324b) and the P$^+$ implantation zone 325 in an SRAM cell array region is formed by simple lines and spaces. Further, the storage nodes and the gate lines in the SRAM cell are formed only in a rectangular shape. This makes it possible to easily correct a pattern shape by OPC (optical Proximity Correction), and provide a layout suitable for achieving a sufficiently-small SRAM cell area.

In the third embodiment, a source and a drain in each of the transistors constituting the SRAM are defined as follows. In regard to the driver transistor (Qn31, Qn41), the diffusion layer formed in an upper portion of the pillar-shaped semiconductor layer and connected to the ground potential is defined as a source diffusion layer, and the diffusion layer formed underneath the pillar-shaped semiconductor layer is defined as a drain diffusion layer. In regard to the load transistor (Qp11, Qp21), the diffusion layer formed in an upper portion of the pillar-shaped semiconductor layer and connected to the power supply potential is defined as a source diffusion layer, and the diffusion layer formed underneath the pillar-shaped semiconductor layer is defined as a drain diffusion layer. In regard to the access transistor (Qn11, Qn21), although each of the diffusion layer formed in an upper portion of a pillar-shaped semiconductor layer and the diffusion layer formed underneath the pillar-shaped semiconductor layer serves as a source or a drain depending on an operating state, the diffusion layer formed in the upper portion of the pillar-shaped semiconductor layer and the diffusion layer formed underneath the pillar-shaped semiconductor layer are defined, respectively, as a source diffusion layer and a drain diffusion layer, for descriptive purposes.

Figure 15A:
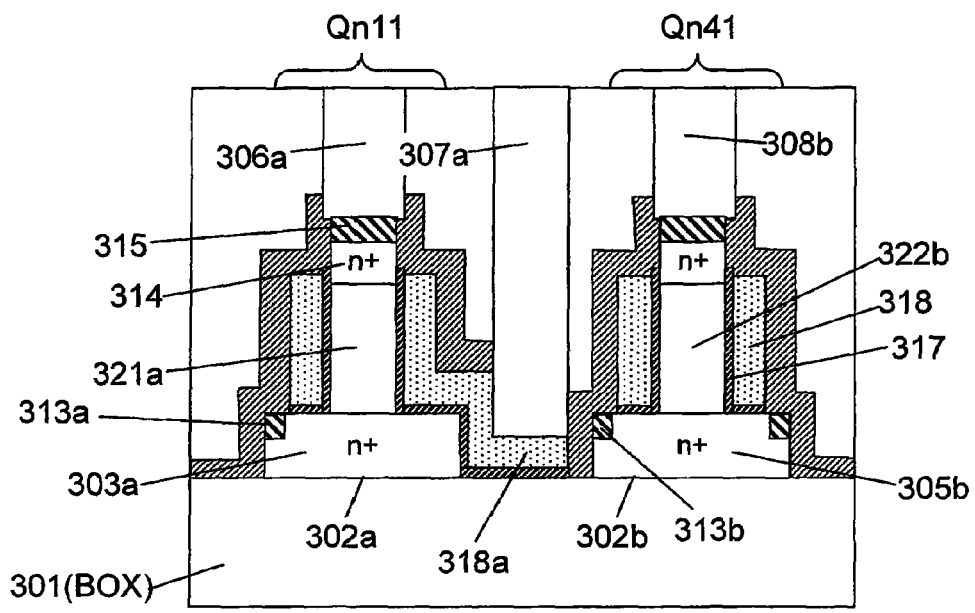
FIGS. 15(a) to 15(d) are sectional views showing the memory cell in the SRAM according to the third embodiment.

With reference to the section views of FIGS. 15(a) to 15(d), a structure of the SRAM according to the third embodiment will be described below. As shown in FIG. 15(a), a planar silicon layer (302a, 302b) serving as a storage node is formed on a buried oxide film layer (BOX) 301, and an N⁺ drain diffusion layer (303a, 305b) is formed in the planar silicon layer (302a, 302b) by impurity implantation or the like. An element isolation region for isolating between the planar silicon layers 302a, 302b can be formed simply by dividing a continuous planar silicon layer into two pieces by etching. Thus, the element isolation region can be formed in a minimum fabrication size through a process having a less number of steps. A silicide layer (313a, 313b) is formed in an upper surface of the N⁺ drain diffusion layer (303a, 305b). A pillar-shaped silicon layer 321a constituting an access transistor Qn11 is formed on the N⁺ drain diffusion layer 303a, and a pillar-shaped silicon layer 322b constituting a driver transistor Qn41 is formed on the N⁺ drain diffusion layer 305b. A gate dielectric film 317 and a gate electrode 318 are formed around each of the pillar-shaped silicon layers. An N⁺ source diffusion layer 314 is formed in an upper portion of the pillar-shaped silicon layer (321a, 322b) by impurity implantation or the like, and a silicide layer 315 is formed in an upper surface of the source diffusion layer 314. A contact 306a formed on the access transistor Qn11 is connected to a bit line BL1, and a contact 307a formed on a gate line 318a extending from the gate electrode of the access transistor Qn11 is connected to a word line WL1. A contact 308b formed on the driver transistor Qn41 is connected to a ground potential line Vss1b.

Figure 15B:
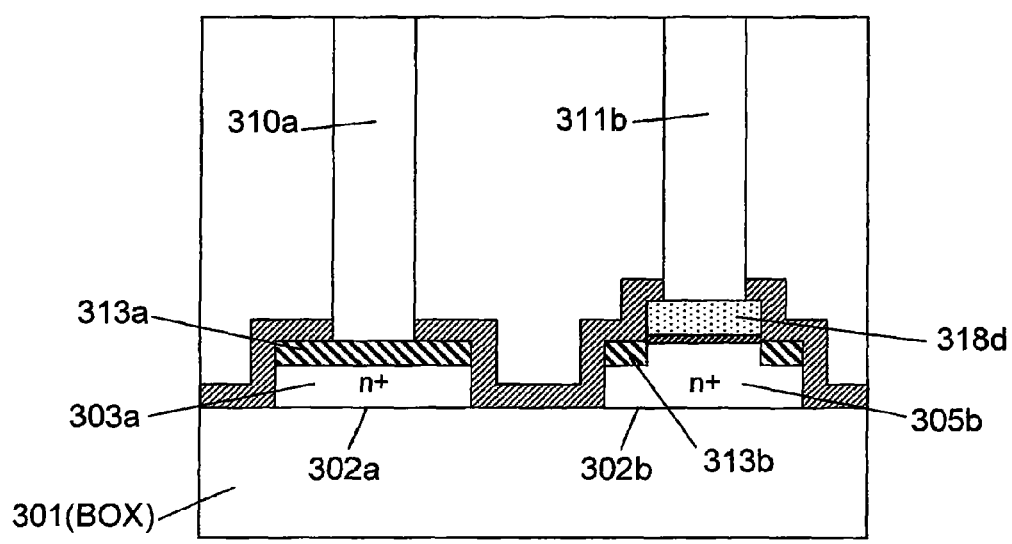

As shown in FIG. 15(b), the planar silicon layer (302a, 302b) serving as a storage node is formed on the buried oxide film layer (BOX) 301, and the N⁺ drain diffusion layer (303a, 305b) is formed in the planar silicon layer (302a, 302b) by impurity implantation or the like. The silicide layer (313a, 313b) is formed in the upper surface of the N⁺ drain diffusion layer (303a, 305b). A contact 310a is formed on the drain diffusion layer 303a at a boundary between the N⁺ drain diffusion layer 303a and the P⁺ drain diffusion layer 304a, and connected to a contact 311b formed on a gate line 318d extending from the respective gate electrodes of the driver transistor Qn41 and the load transistor Qp21, through a storage node interconnection line Na1.

Figure 15C:
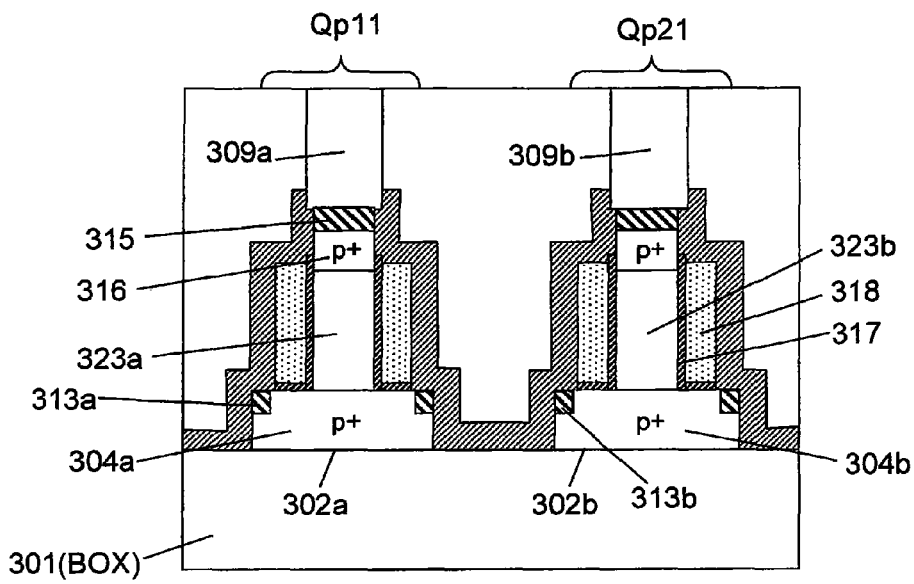

As shown in FIG. 15(c), the planar silicon layer (302a, 302b) serving as a storage node is formed on the buried oxide film layer (BOX) 301, and a P⁺ drain diffusion layer (304a, 304b) is formed in the planar silicon layer (302a, 302b) by impurity implantation or the like. The silicide layer (313a, 313b) is formed in an upper surface of the P⁺ drain diffusion layer (304a, 304b). A pillar-shaped silicon layer 323a constituting a load transistor Qp11 is formed on the P⁺ drain diffusion layer 304a, and a pillar-shaped silicon layer 323b constituting a load transistor Qp21 is formed on the P⁺ drain diffusion layer 304b. The gate dielectric film 317 and the gate electrode 318 are formed around each of the pillar-shaped silicon layers. A P⁺ source diffusion layer 316 is formed in an upper portion of the pillar-shaped silicon layer (323a, 323b) by impurity implantation or the like, and the silicide layer 315 is formed in an upper surface of the source diffusion layer 316. A contact (309a, 309b) formed on the load transistor (Qp11, Qp21) is connected to a power supply potential line Vcc1 through an interconnection layer.

Figure 15D:
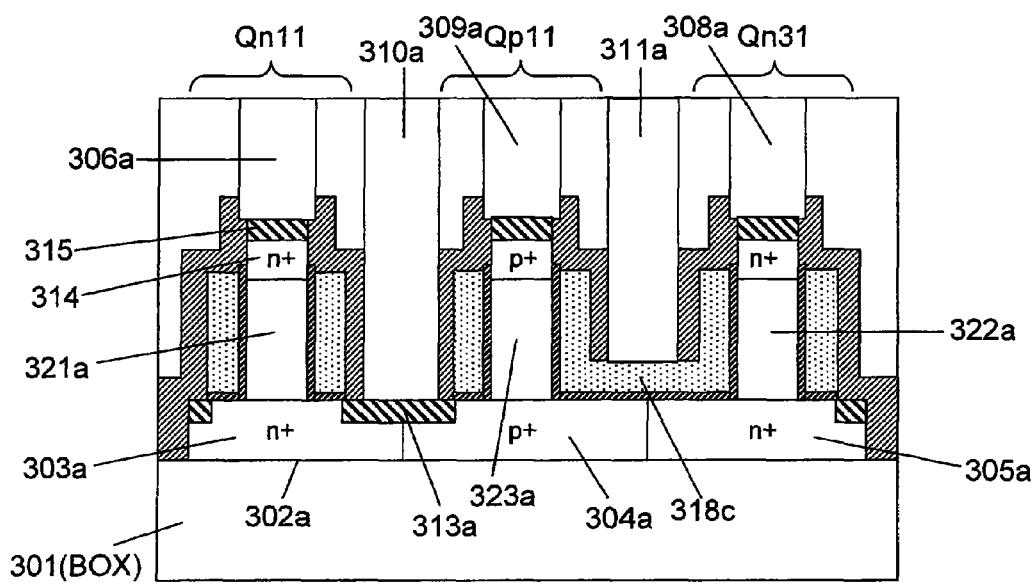
Figure 16:
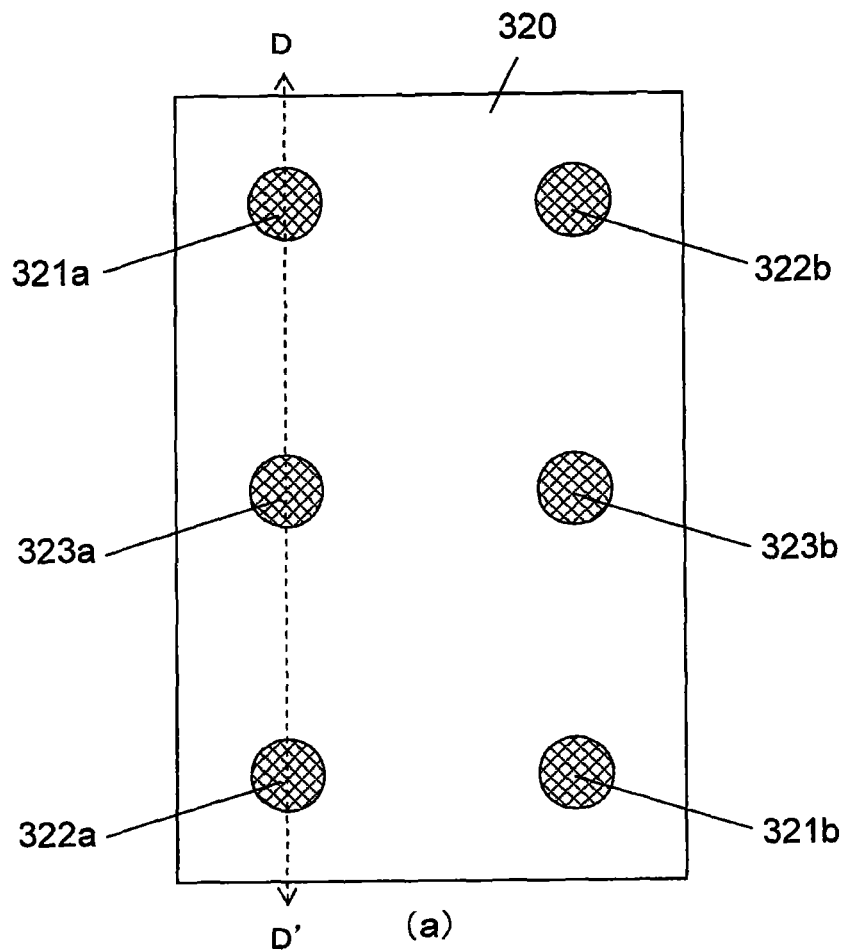
FIGS. 16(a) and 16(b) are process diagrams showing a production process of the SRAM according to the third embodiment, on a step-by-step basis.
Figure 16:
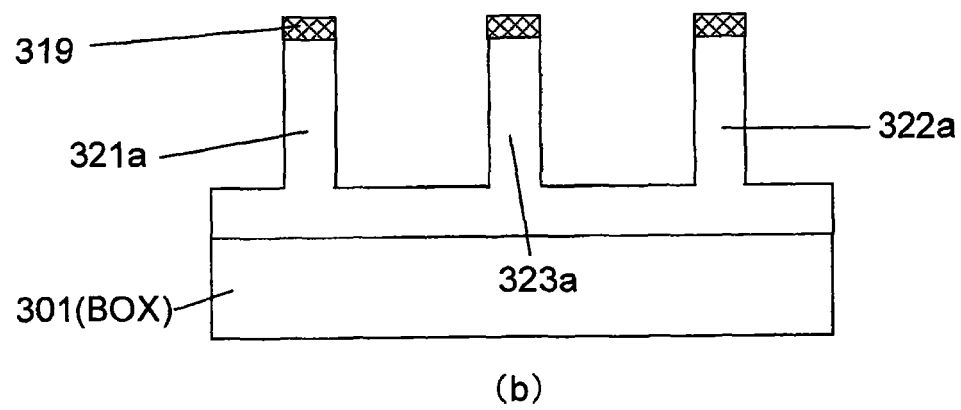
Figure 17:
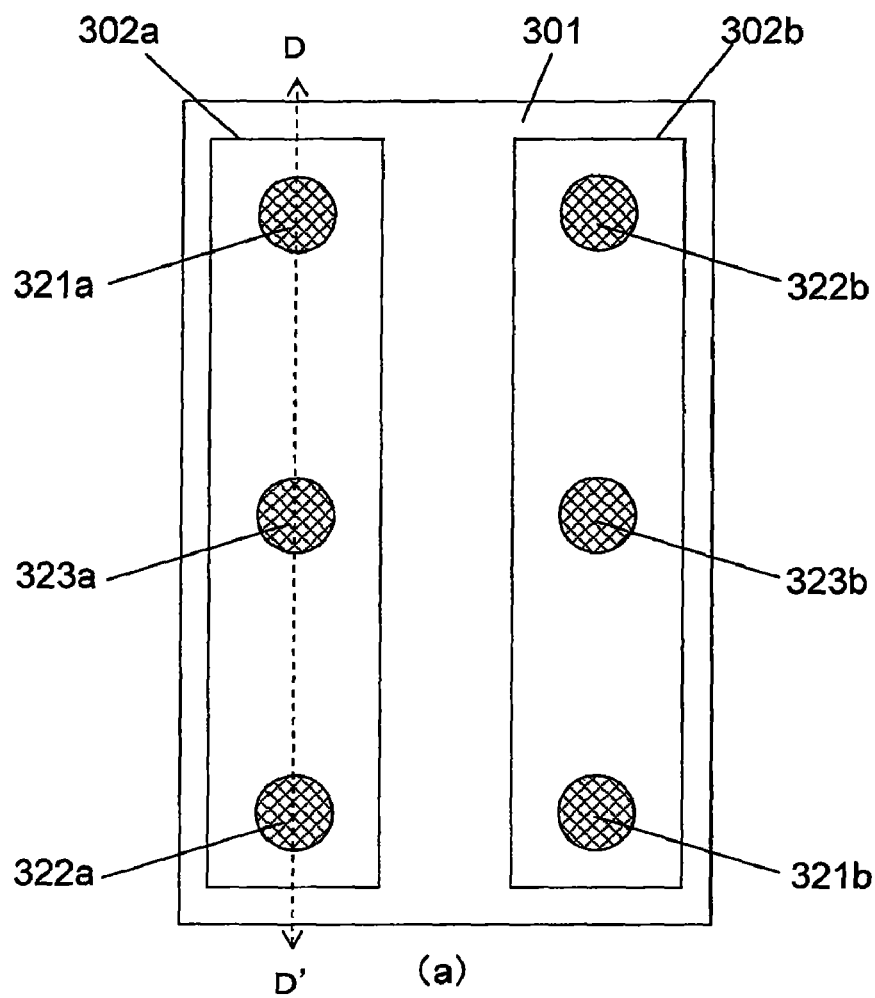
FIGS. 17(a) and 17(b) are process diagrams showing the production process of the SRAM according to the third embodiment, on a step-by-step basis.
Figure 17:
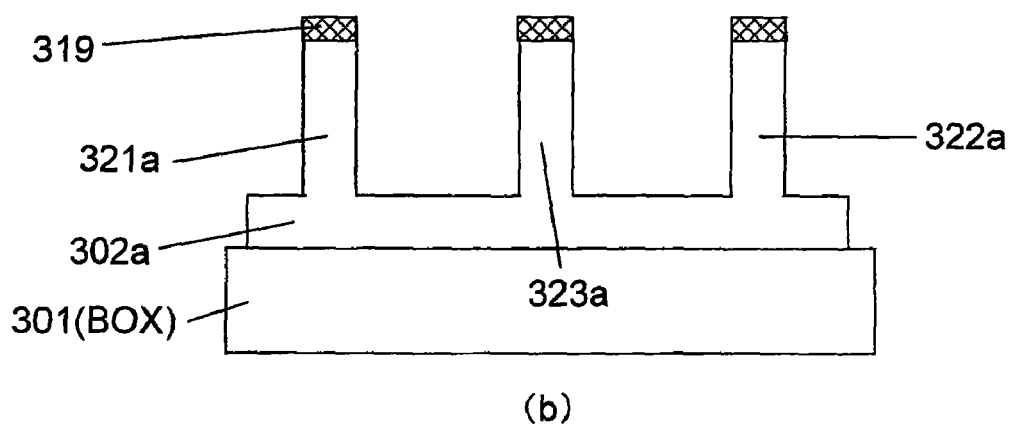
Figure 18:
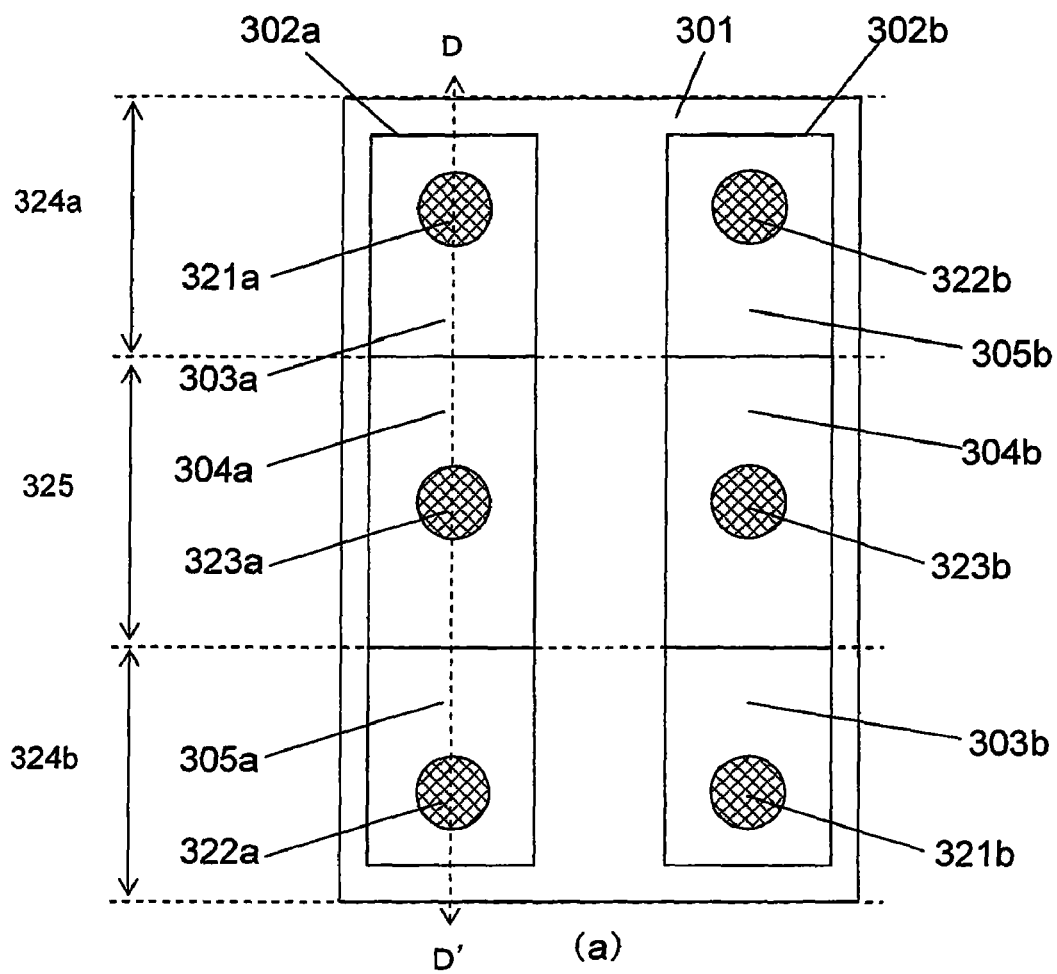
FIGS. 18(a) and 18(b) are process diagrams showing the production process of the SRAM according to the third embodiment, on a step-by-step basis.
Figure 18:
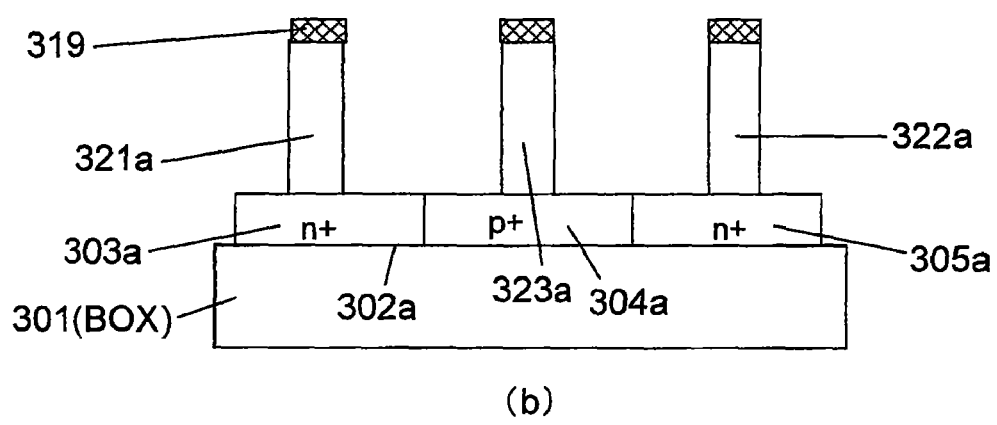
Figure 19:
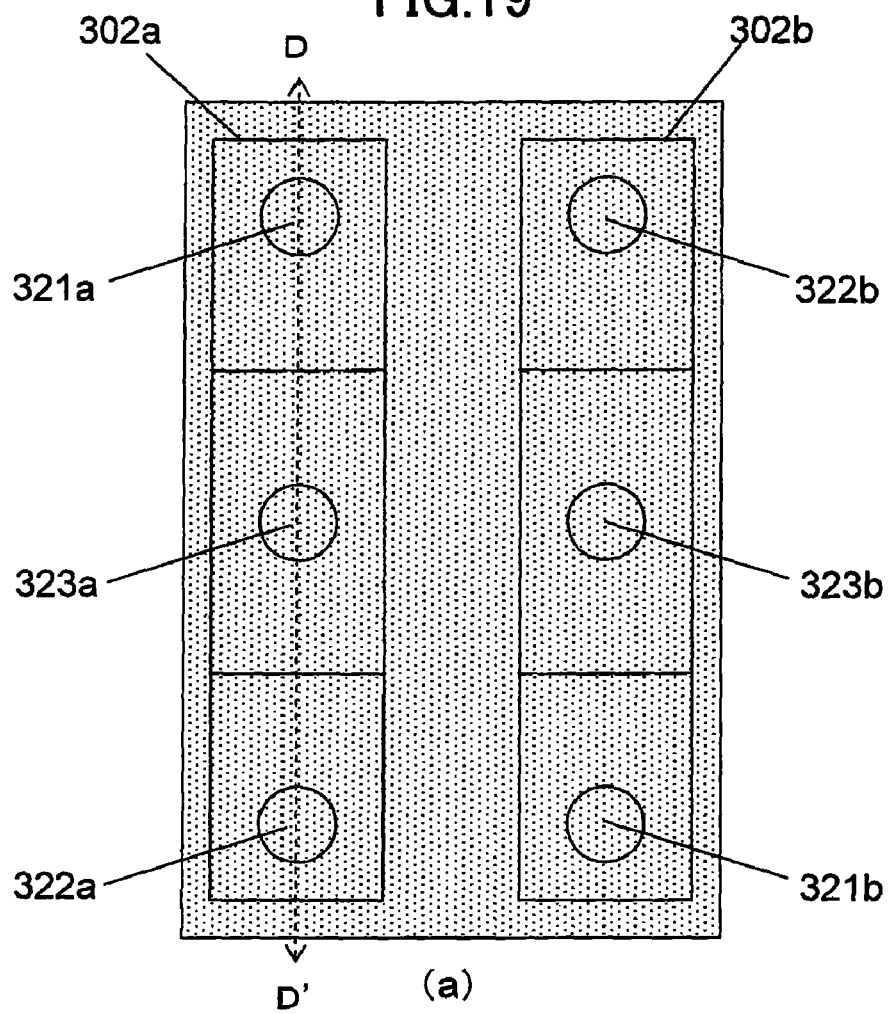
FIGS. 19(a) and 19(b) are process diagrams showing the production process of the SRAM according to the third embodiment, on a step-by-step basis.
Figure 19:
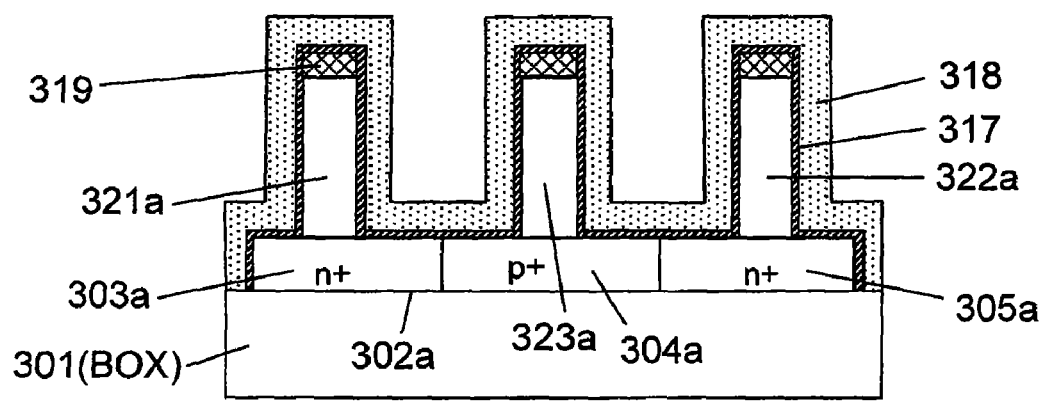
Figure 20:
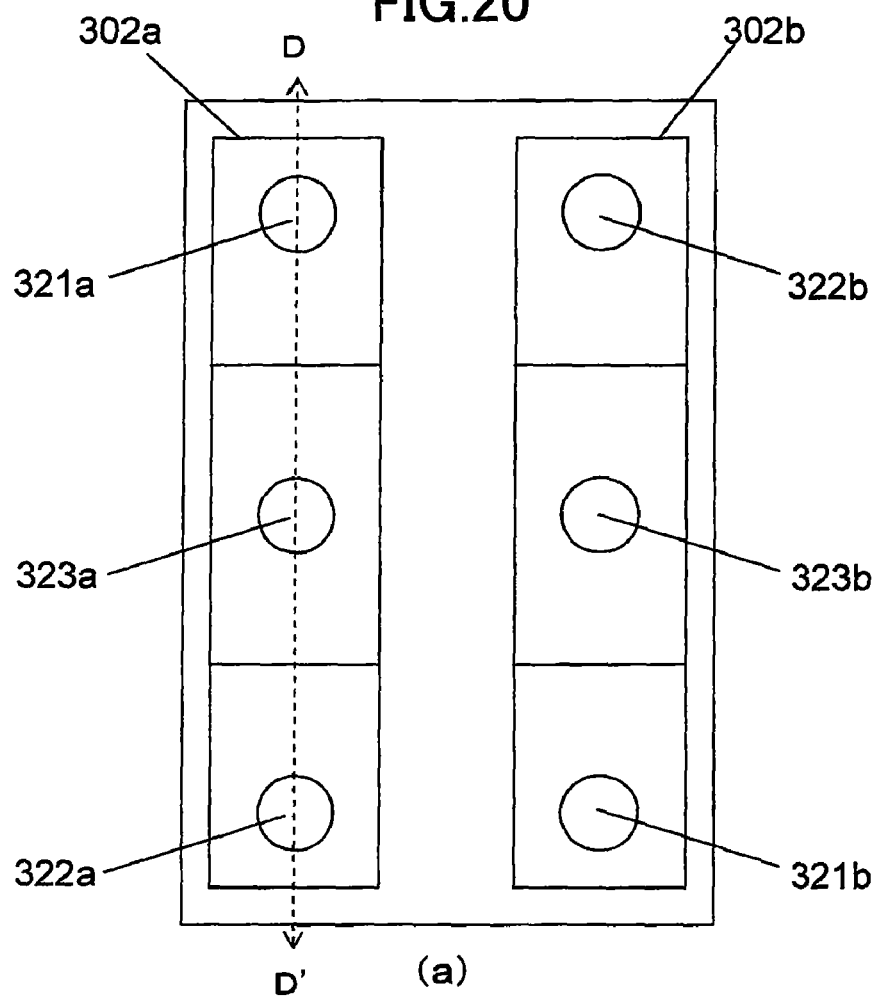
FIGS. 20(a) and 20(b) are process diagrams showing the production process of the SRAM according to the third embodiment, on a step-by-step basis.
Figure 20:
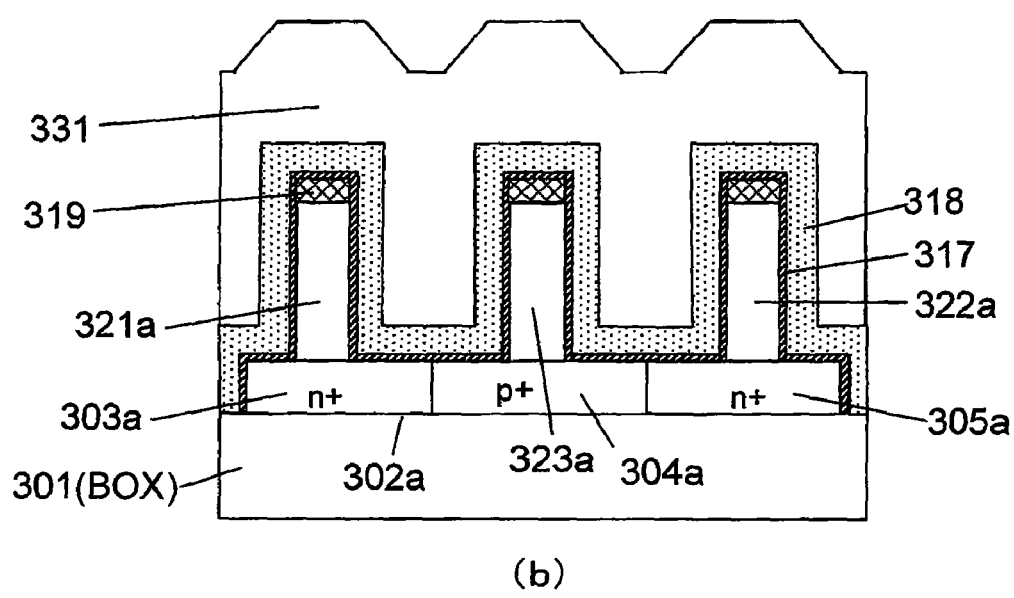
Figure 21:
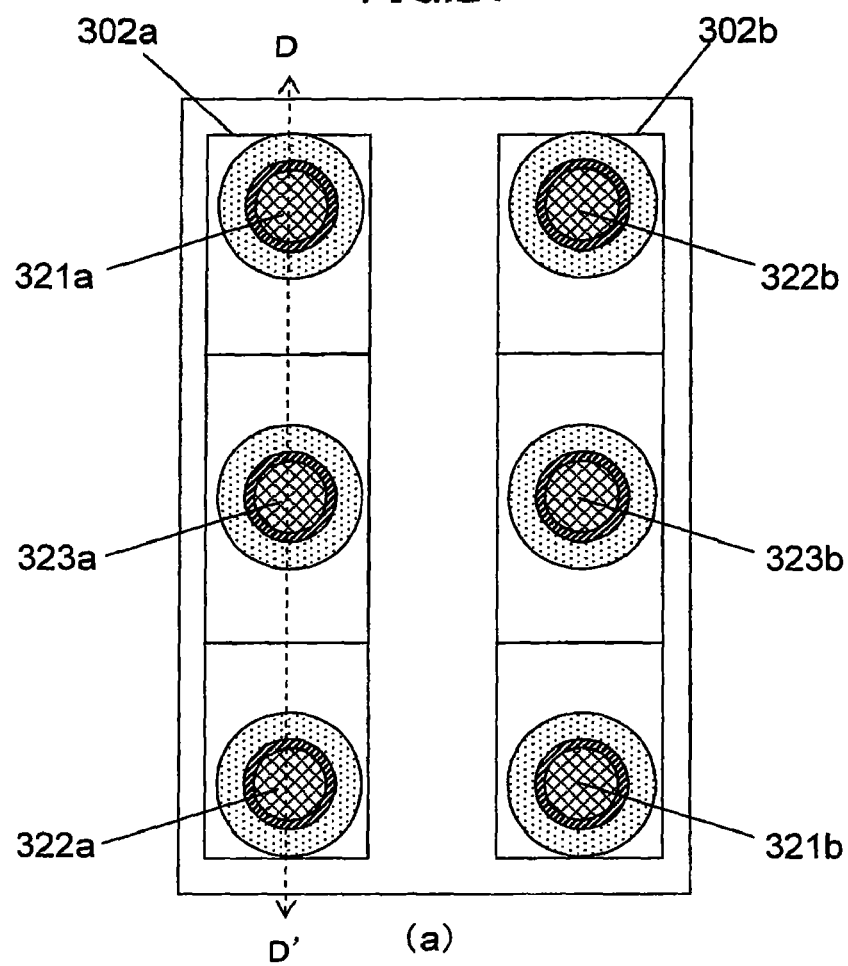
FIGS. 21(a) and 21(b) are process diagrams showing the production process of the SRAM according to the third embodiment, on a step-by-step basis.
Figure 21:
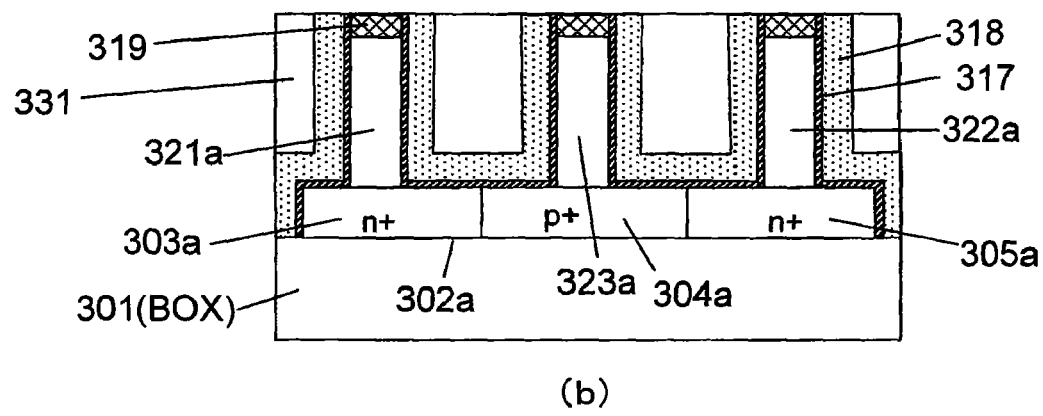
Figure 22:
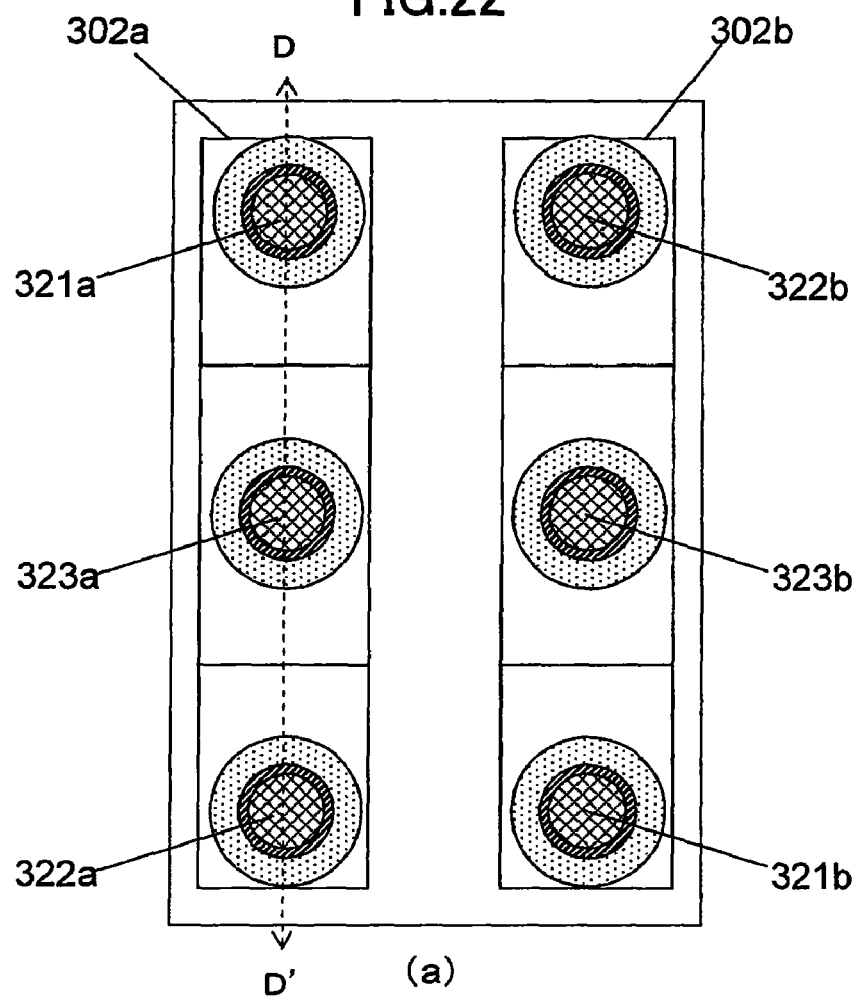
FIGS. 22(a) and 22(b) are process diagrams showing the production process of the SRAM according to the third embodiment, on a step-by-step basis.
Figure 22:
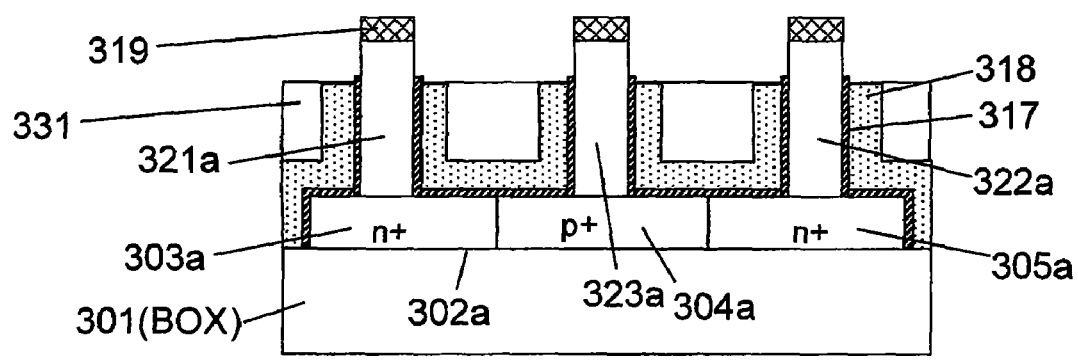
Figure 23:
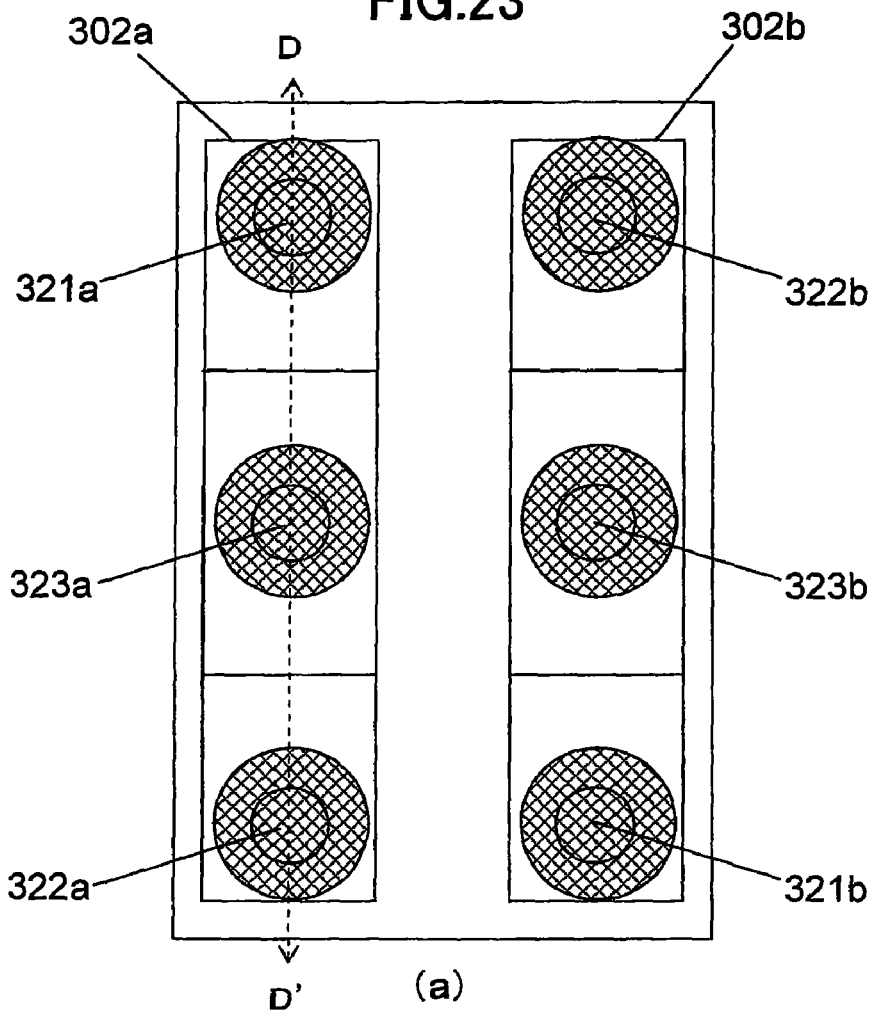
FIGS. 23(a) and 23(b) are process diagrams showing the production process of the SRAM according to the third embodiment, on a step-by-step basis.
Figure 23:
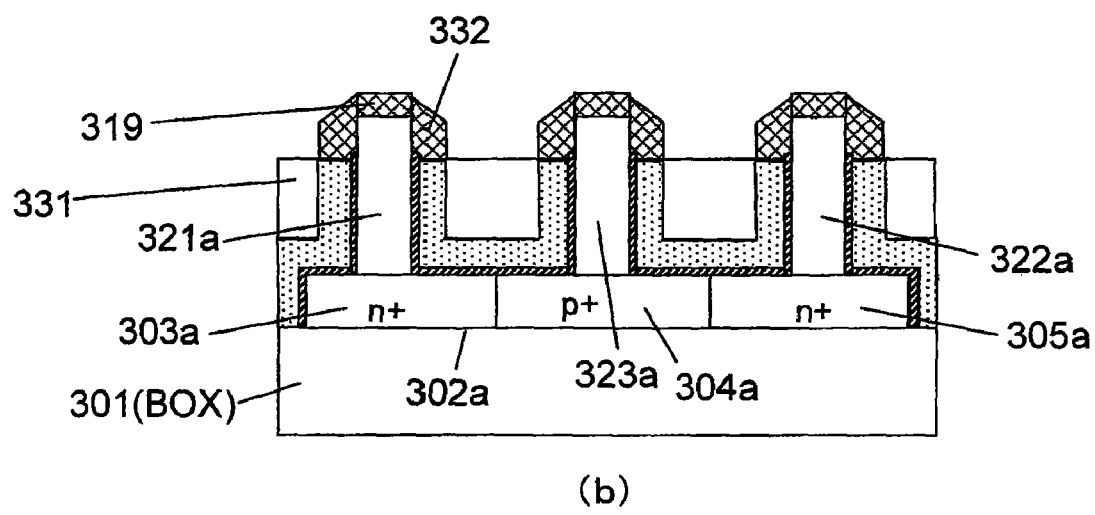
Figure 24:
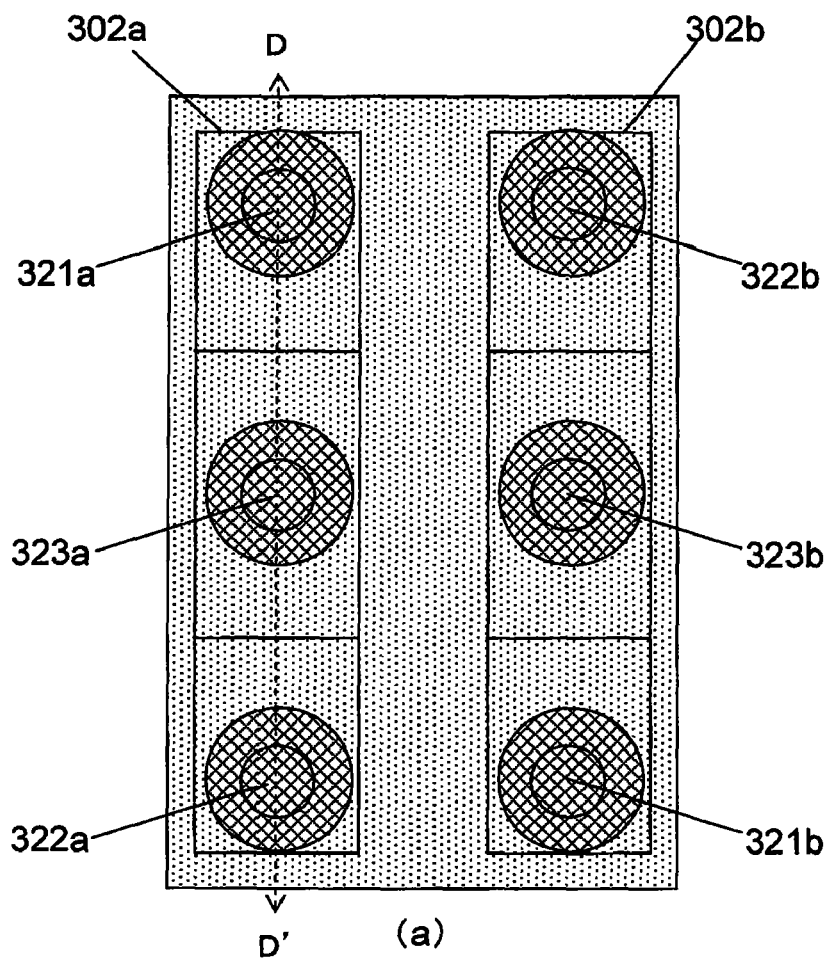
FIGS. 24(a) and 24(b) are process diagrams showing the production process of the SRAM according to the third embodiment, on a step-by-step basis.
Figure 24:
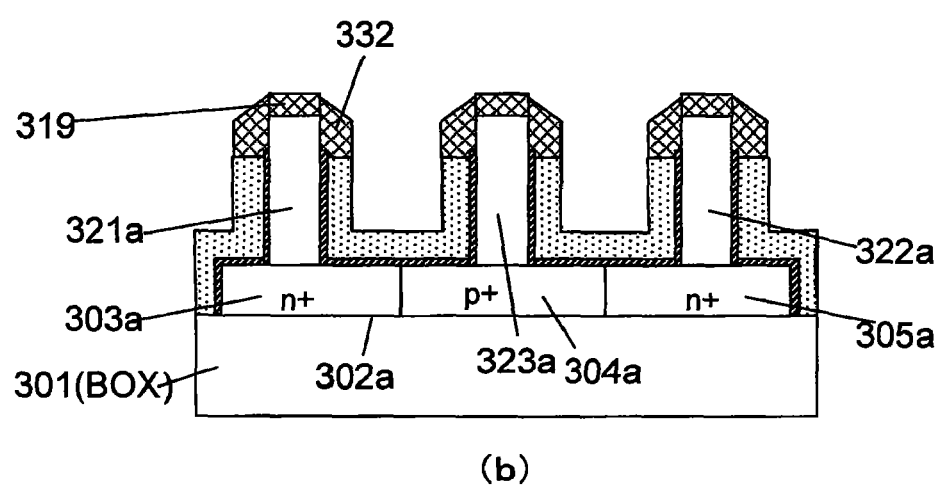
Figure 25:
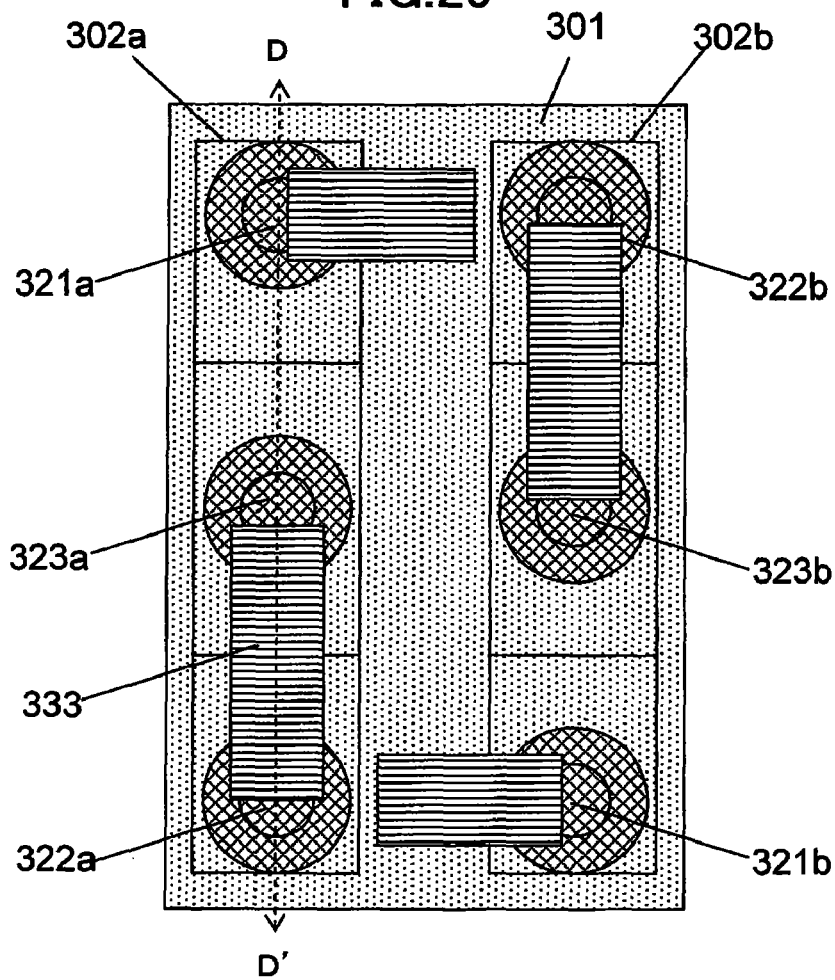
FIGS. 25(a) and 25(b) are process diagrams showing the production process of the SRAM according to the third embodiment, on a step-by-step basis.
Figure 25:
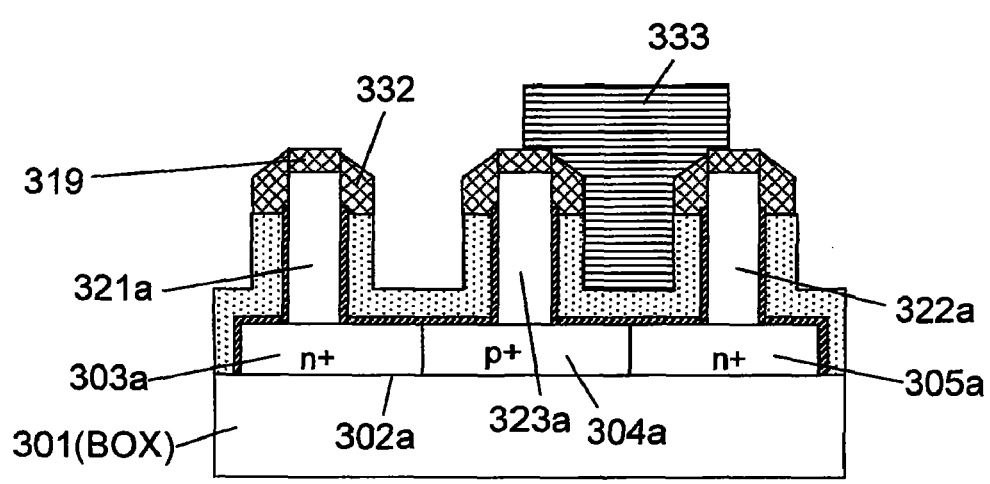
Figure 26:
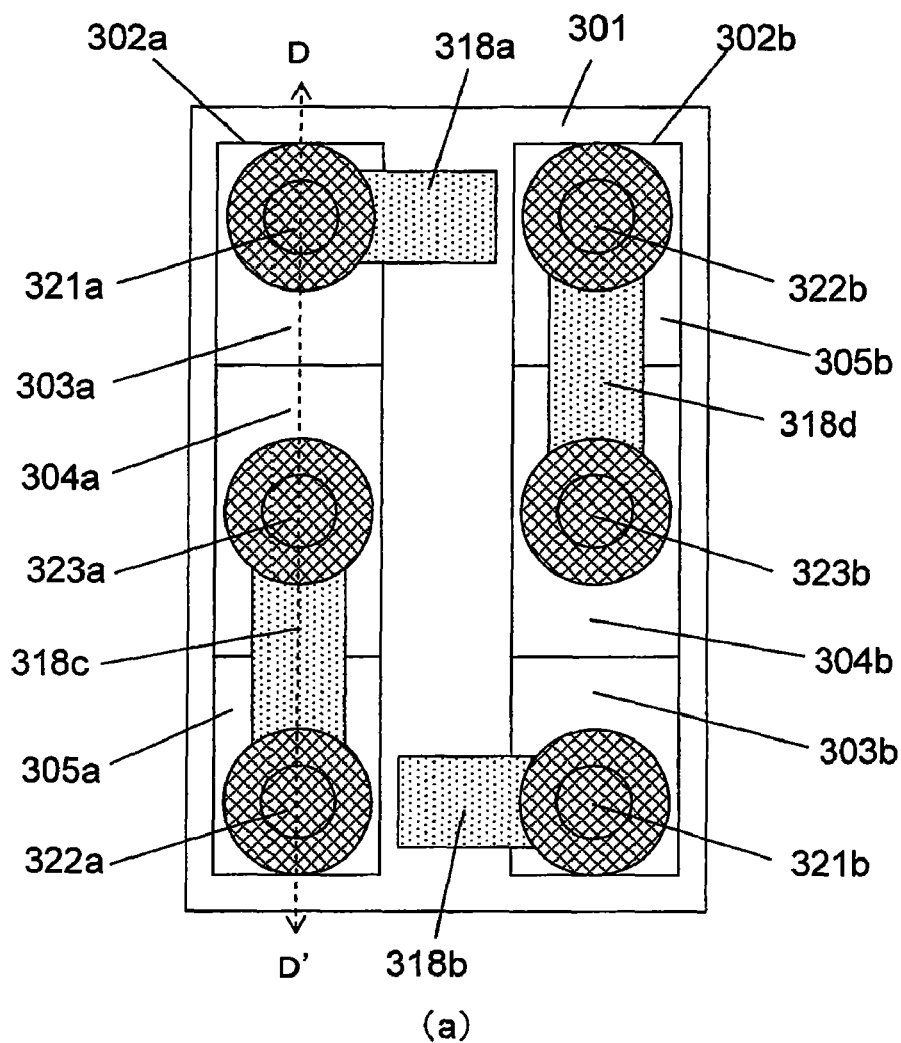
FIGS. 26(a) and 26(b) are process diagrams showing the production process of the SRAM according to the third embodiment, on a step-by-step basis.
Figure 26:
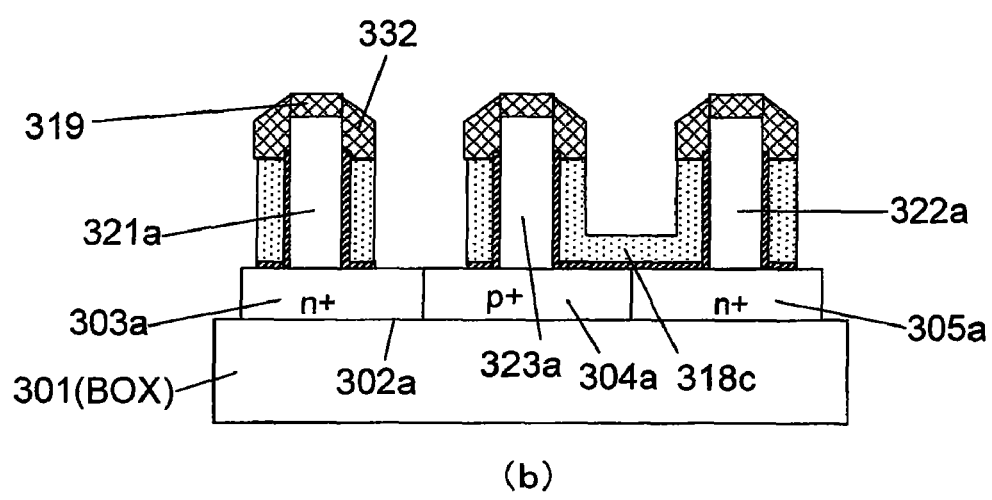
Figure 27:
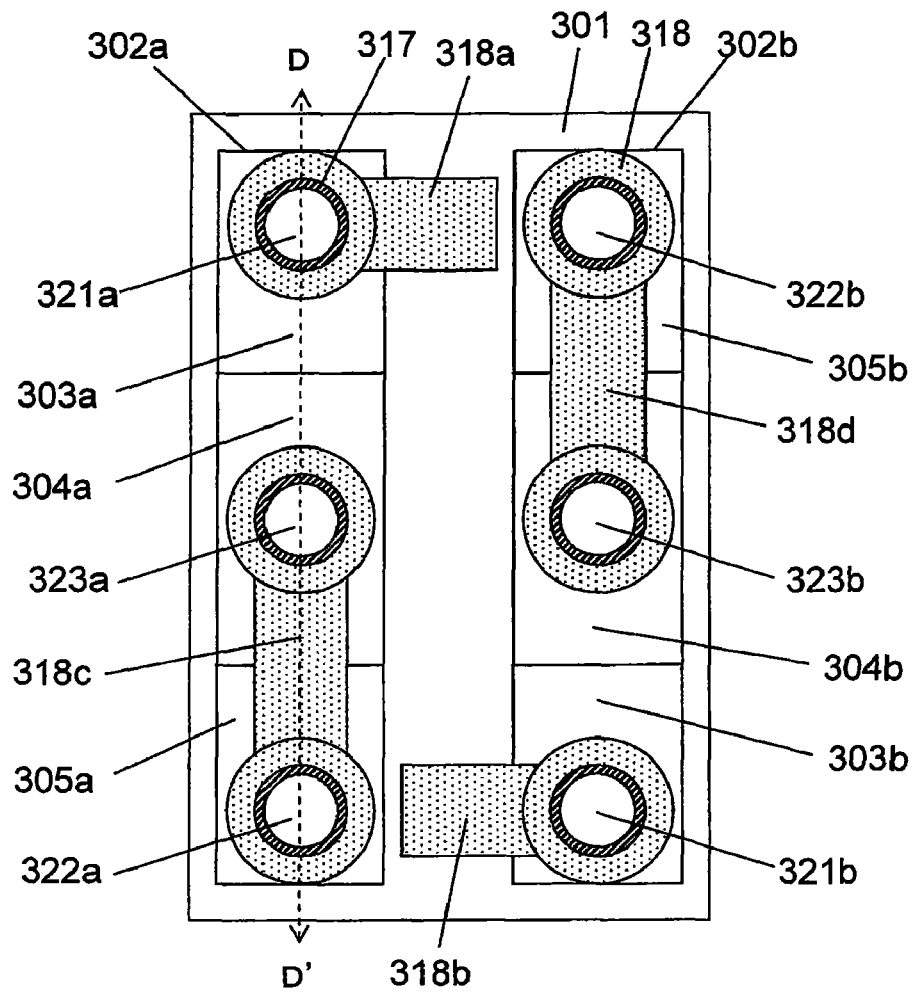
FIGS. 27(a) and 27(b) are process diagrams showing the production process of the SRAM according to the third embodiment, on a step-by-step basis.
Figure 27:
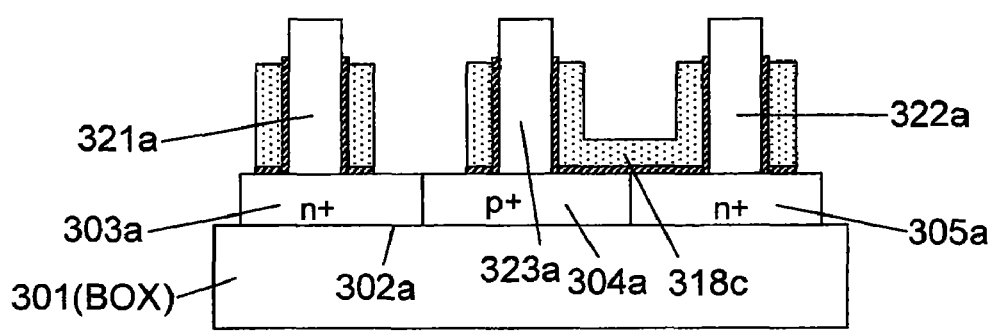
Figure 28:
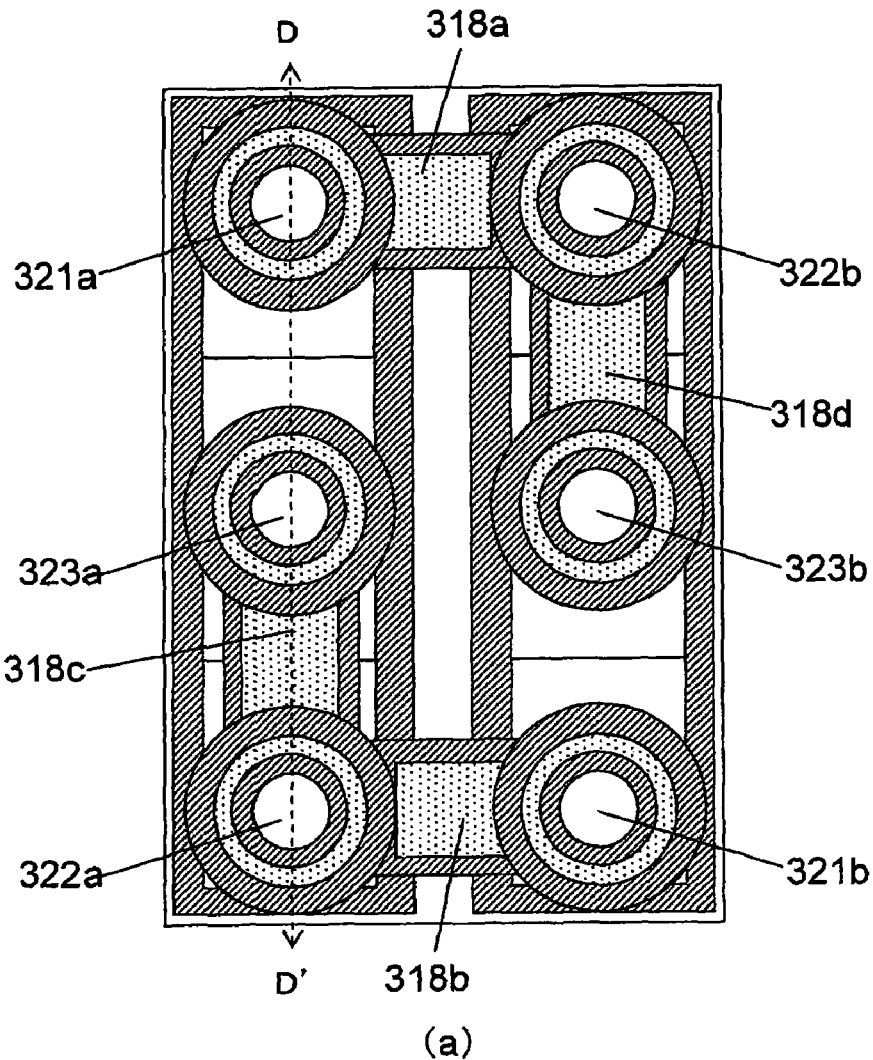
FIGS. 28(a) and 28(b) are process diagrams showing the production process of the SRAM according to the third embodiment, on a step-by-step basis.
Figure 28:
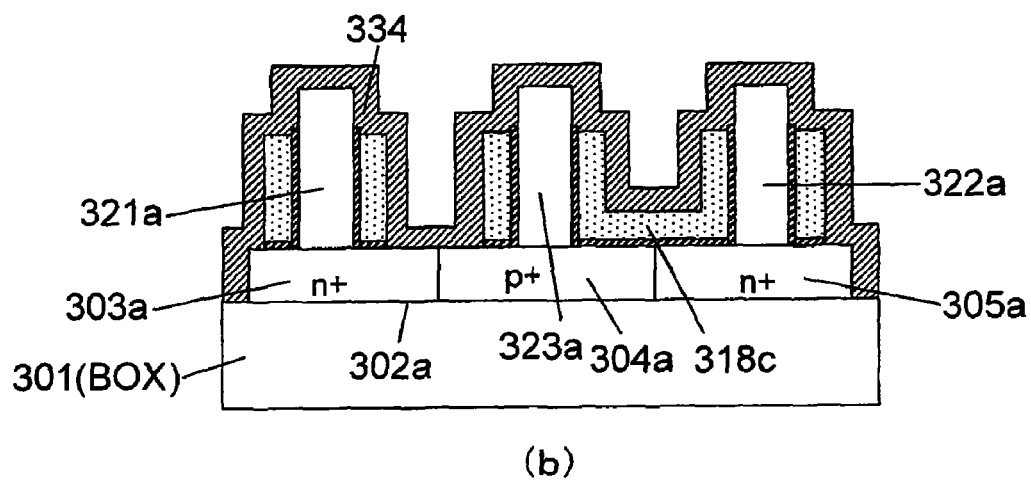
Figure 29:
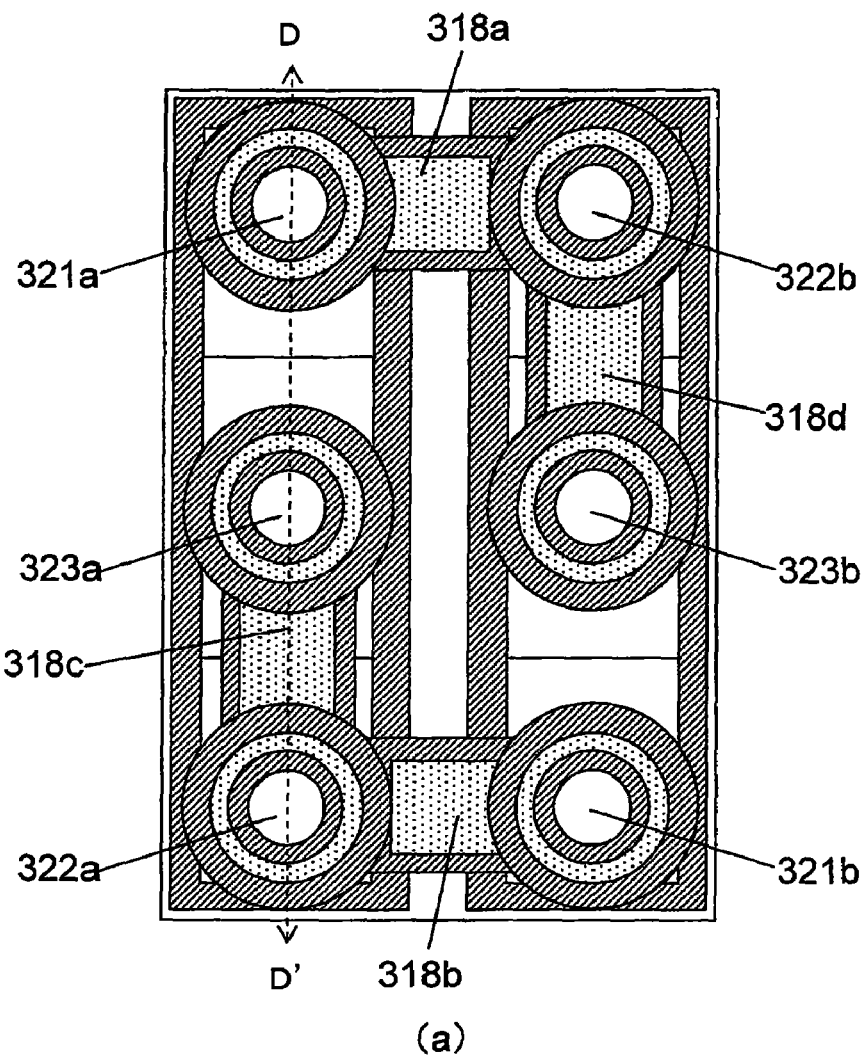
FIGS. 29(a) and 29(b) are process diagrams showing the production process of the SRAM according to the third embodiment, on a step-by-step basis.
Figure 29:
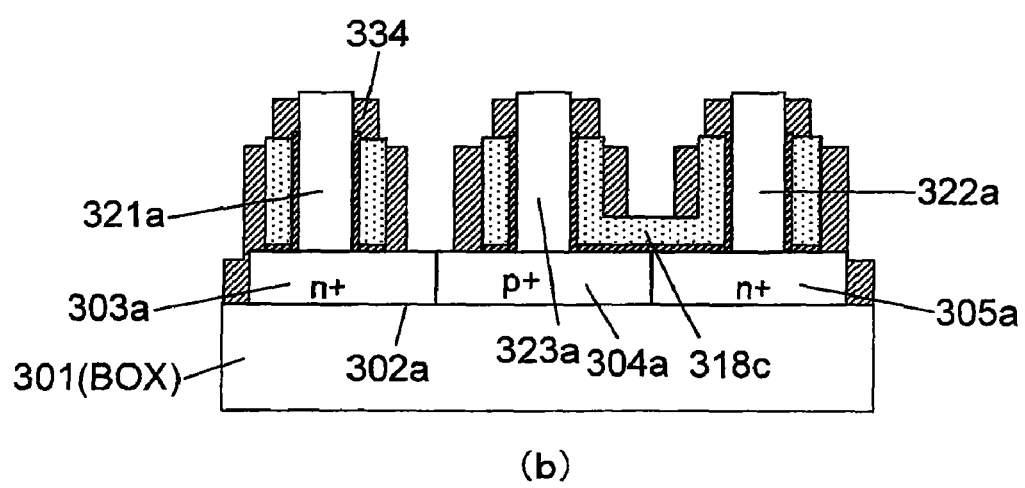
Figure 30:
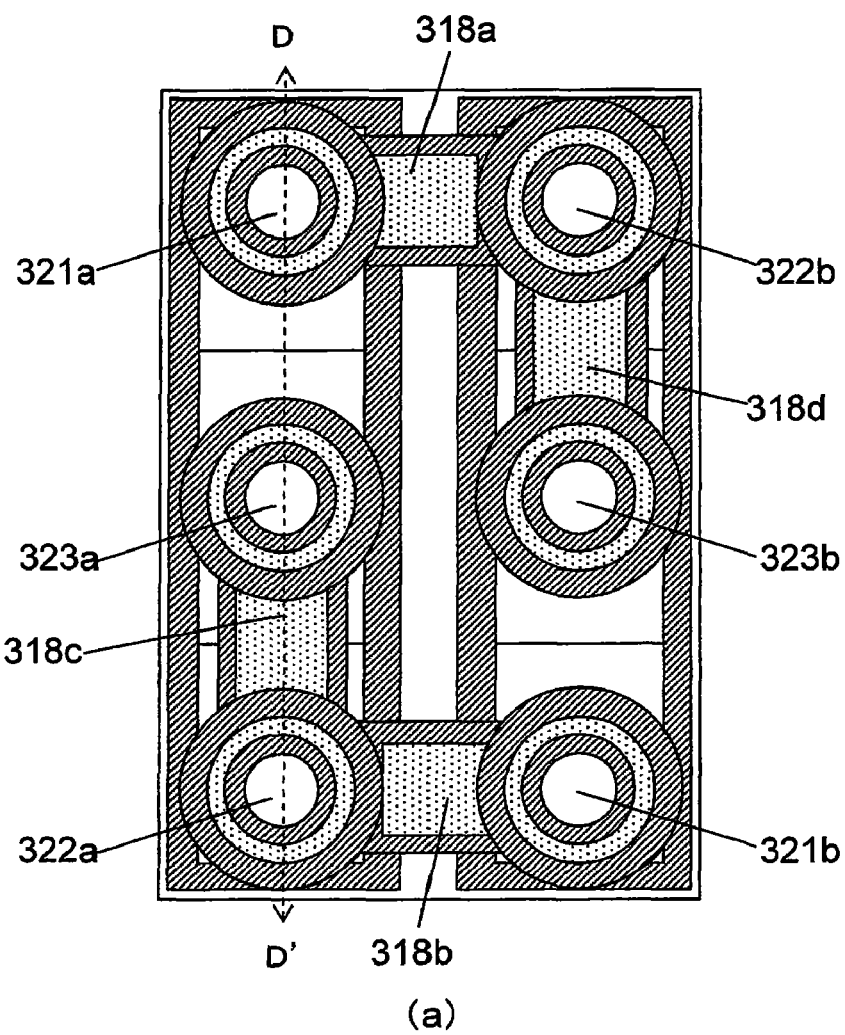
FIGS. 30(a) and 30(b) are process diagrams showing the production process of the SRAM according to the third embodiment, on a step-by-step basis.
Figure 30:
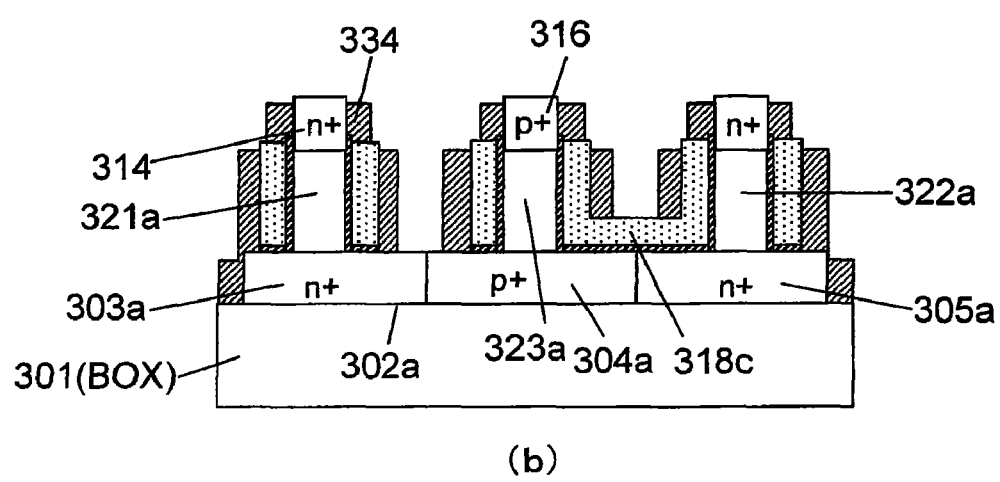
Figure 31:
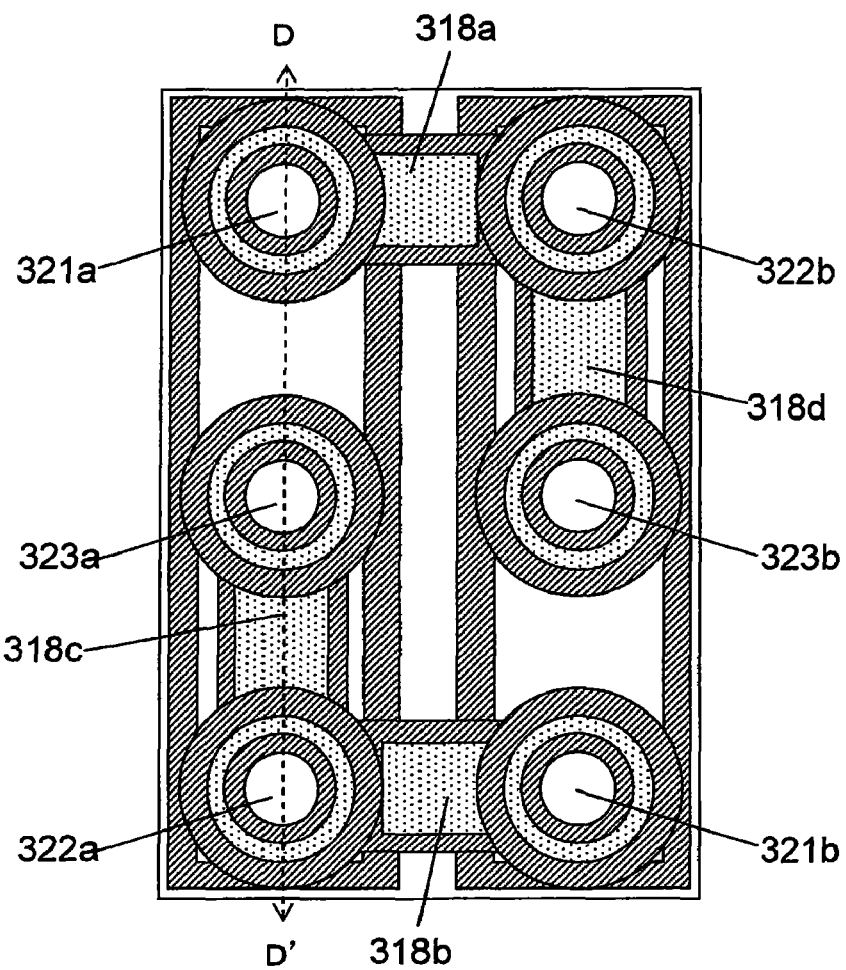
FIGS. 31(a) and 31(b) are process diagrams showing the production process of the SRAM according to the third embodiment, on a step-by-step basis.
Figure 31:
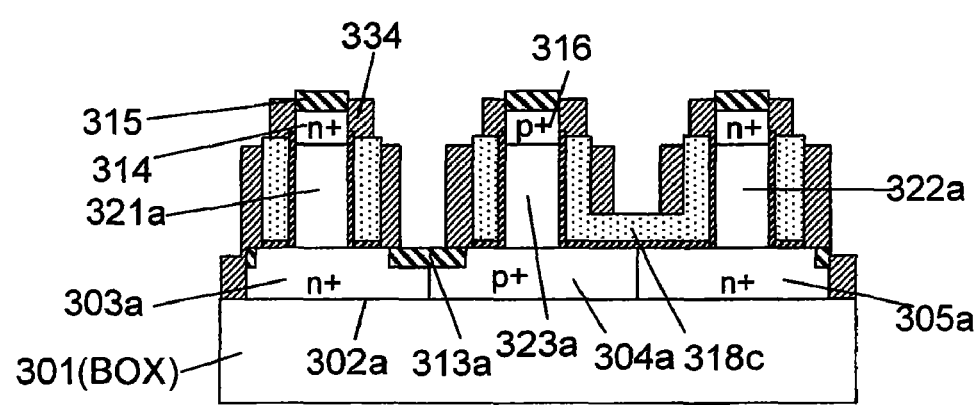
Figure 32:
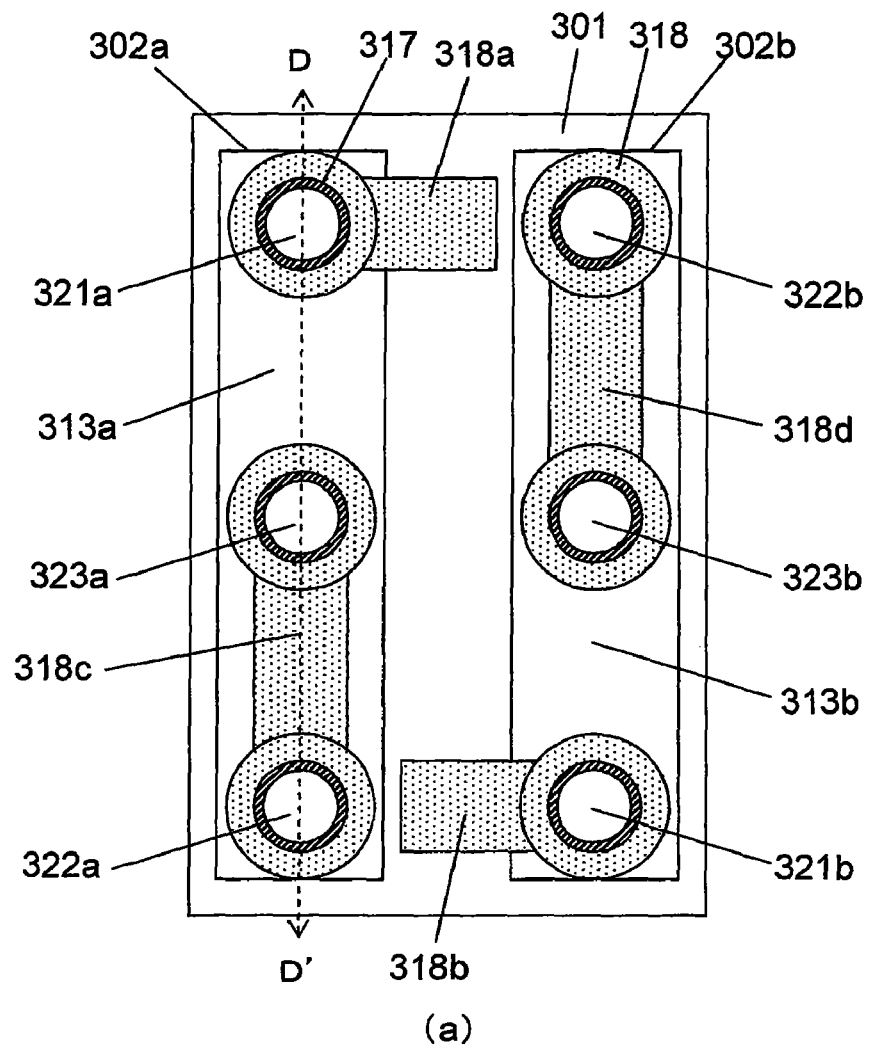
FIGS. 32(a) and 32(b) are process diagrams showing the production process of the SRAM according to the third embodiment, on a step-by-step basis.
Figure 32:
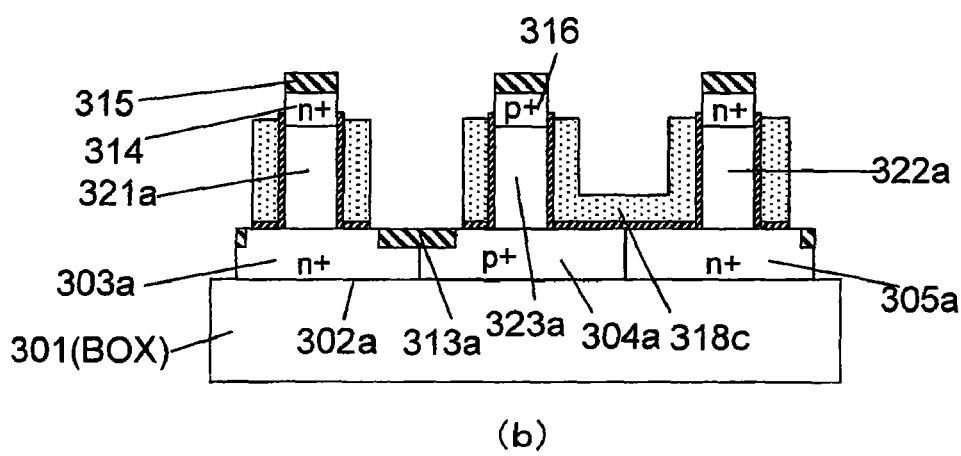
Figure 33:
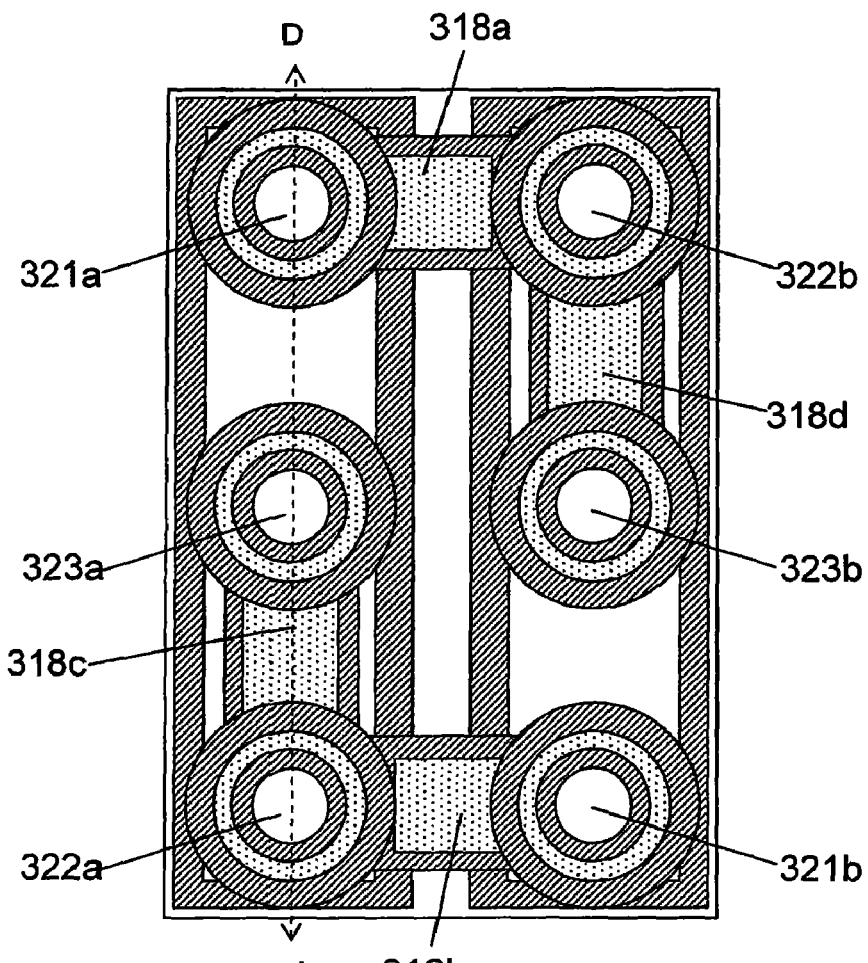
FIGS. 33(a) and 33(b) are process diagrams showing the production process of the SRAM according to the third embodiment, on a step-by-step basis.
Figure 33:
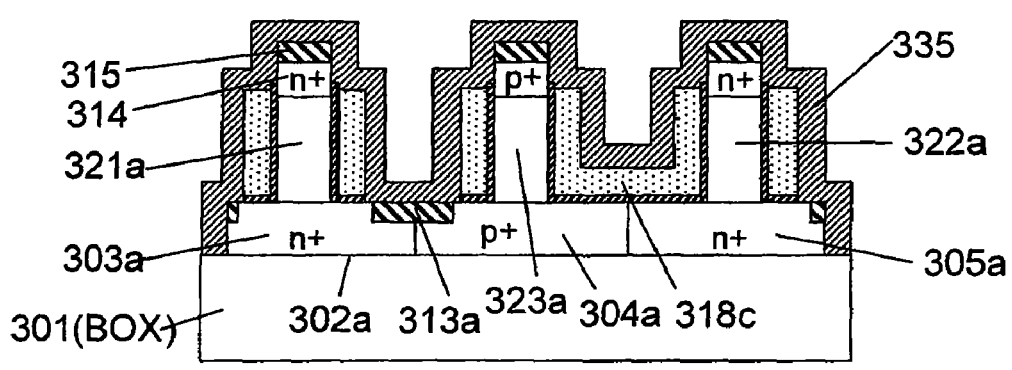
Figure 34:
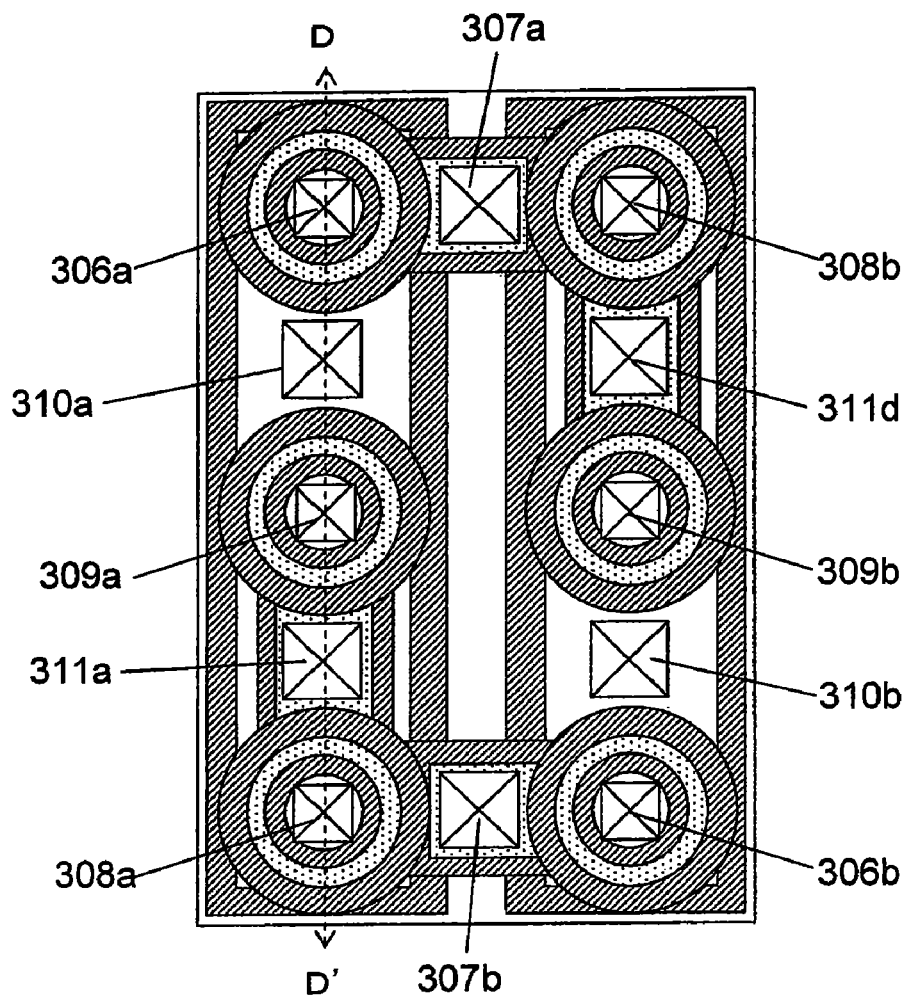
FIGS. 34(a) and 34(b) are process diagrams showing the production process of the SRAM according to the third embodiment, on a step-by-step basis.
Figure 34:
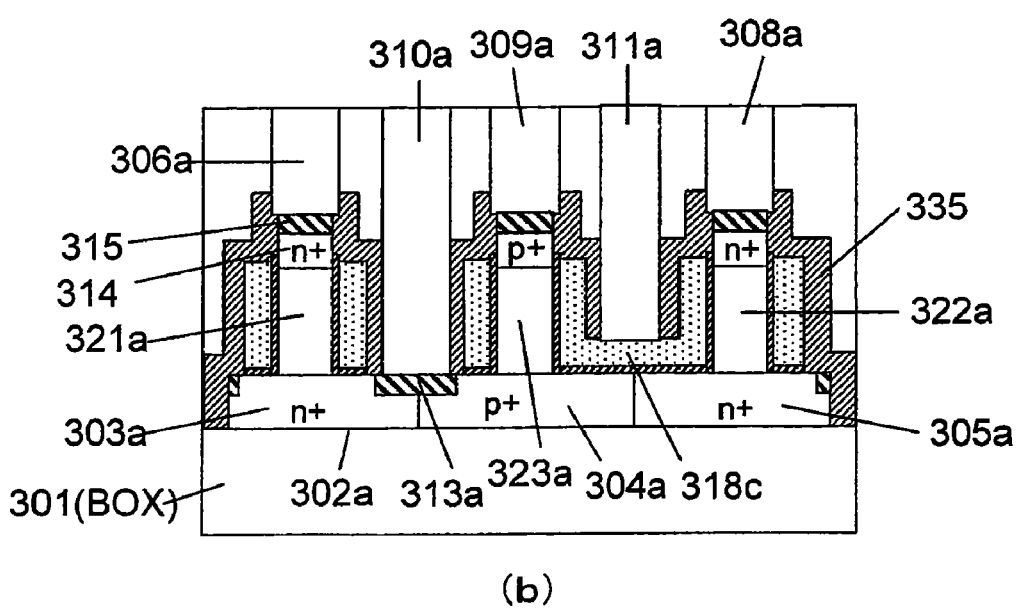

As shown in FIG. 15(d), the planar silicon layer 302a serving as a storage node is formed on the buried oxide film layer (BOX) 301, and the N⁺ drain diffusion layer 303a, the P⁺ drain diffusion layer 304a and an N⁺ drain diffusion layer 305a are formed in the planar silicon layer 302a by impurity implantation or the like. The silicide layer 313a is formed in the upper surface of the N⁺ drain diffusion layer (303a, 305a) and the P⁺ drain diffusion layer 304a, so that the N⁺ drain diffusion layer (303a, 305a) and the P⁺ drain diffusion layer 304a are directly connected to each other. Thus, there is no necessity to form an element isolation region for isolating between the N⁺ and P⁺ drain diffusion layers and a contact for connecting the N⁺ and P⁺ drain diffusion layers. The pillar-shaped silicon layer 321a constituting the access transistor Qn11, a pillar-shaped silicon layer 322a constituting a driver transistor Qn31, and the pillar-shaped silicon layer 323a constituting the load transistor Qp11, are formed on the N⁺ drain diffusion layer 303a, the N⁺ drain diffusion layer 305a and the P⁺ drain diffusion layer 304a, respectively. The N⁺ drain diffusion layer 303a, the P⁺ drain diffusion layer 304a and the N⁺ drain diffusion layer 305a are directly connected to each other through the silicide layer 313a formed in an upper surface of the planar silicon layer 302a.

The gate dielectric film 317 and the gate electrode 318 are formed around each of the pillar-shaped silicon layers. The source diffusion layer is formed in the upper portion of each of the pillar-shaped silicon layers by impurity implantation or the like, and the silicide layer 315 is formed in the upper surface of the source diffusion layer. The contact 306a formed on the access transistor Qn11 is connected to the bit line BL1, and a contact 308a formed on the driver transistor Qn31 is connected to a ground potential line Vss1a. The contact 309a formed on the load transistor Qp11 is connected to the power supply potential line Vcc1.

A contact 311a formed on a gate line 318c extending from respective gate electrodes of the driver transistor Qn31 and the load transistor Qp11 is connected to a contact 310b formed on the drain diffusion layer of the storage node 302b, through a storage node interconnection line Nb1. The contact 311a formed on the interconnection line is connected to the contact 316b connected to the planar silicon layer 305b, through the interconnection line Na1.

In the third embodiment, the N⁺ drain diffusion layers and the P⁺ drain diffusion layer each formed in the planar silicon layer (302a, 302b) serving as a storage node are directly connected to each other through the silicide layer formed in the upper surface of the planar silicon layer, so that the drain regions of the access transistor, the driver transistor and the load transistor serve as a storage node of the SRAM cell in a shared manner.

In the third embodiment, a silicon nitride film-based spacer is removed after formation of the silicide layers, so that a nitride film formed around the gate electrode consists only of a contact-stopper silicon nitride film. This makes it possible to narrow a distance between the pillar-shaped silicon layer and the contact to reduce an SRAM area.

With reference to FIGS. 16(a) to 34(b), one example of a production method for forming the SRAM according to the third embodiment will be described below. In FIGS. 16(a) to 34(b), the figure suffixed with (a) is a top plan view, and the figure suffixed with (b) is a sectional view taken along the line D-D' in the figure suffixed with (a).

As shown in FIGS. 16(a) and 16(b), a mask 319 of a silicon nitride film is formed on an SOI substrate in which a silicon layer is formed on a buried oxide film layer (BOX) 301. Then, a pattern for a pillar-shaped silicon layer (321a to 323a, 321b to 323b) is formed by lithography, and the silicon layer is etched to form the pillar-shaped silicon layer (321a to 323a, 321b to 323b). In this step, a continuous planar silicon layer is formed underneath the pillar-shaped silicon layer.

As shown in FIGS. 17(a) and 17(b), the continuous planar silicon layer is divided to form a planar silicon layer (302a, 302b) serving as a storage node. An element isolation region can be formed simply by dividing the continuous planar silicon layer. Thus, the element isolation region can be formed to have an isolation width equivalent to a minimum fabrication size, through a process having a less number of steps.

As shown in FIGS. 18(a) and 18(b), an impurity is introduced into each of two N+ implantation zones and a P+ implantation zone by ion implantation or the like, to form a drain diffusion layer in the planar silicon layer (302a, 302b) underneath the pillar-shaped silicon layer. Preferably, conditions for the implantation are adjusted to allow the impurity to be distributed to reach the buried oxide film 301 and cover a bottom of the pillar-shaped silicon layer. In this step, the silicon nitride film 319 prevents the impurity from being introduced into an upper portion of the pillar-shaped silicon layer.

As shown in FIGS. 19(a) and 19(b), a gate dielectric film 317 is formed, and then a gate conductive film 318 is formed.

As shown in FIGS. 20(a) and 20(b), a silicon oxide film 331 is formed to fill a space between the pillar-shaped silicon layers.

As shown in FIGS. 21(a) and 21(b), the silicon oxide film 331, and respective portions of the gate conductive film 318 and the gate dielectric film 317 above the pillar-shaped silicon layer, are polished by chemical mechanical polishing (CMP), to flatten a top surface of a gate. During the CMP, the silicon nitride film-based mask 319 on a top of the pillar-shaped silicon layer is used as a CMP stopper. The use of the silicon nitride film-based mask 319 as a CMP stopper makes it possible to control an amount of CMP with high repeatability.

As shown in FIGS. 22(a) and 22(b), the gate conductive film 318 and the silicon oxide film 331 are etched back to form a gate electrode on a sidewall of the pillar-shaped silicon layer so as to set a gate length. Conditions for the etching are adjusted to allow the gate conductive film 318 and the silicon oxide film 331 to be etched at a higher selectivity ratio relative to the silicon nitride film-based mask 319.

As shown in FIGS. 23(a) and 23(b), a silicon nitride film is formed and then etched back to form a silicon nitride film-based sidewall 332 on a top of the metal gate. In this step, an amount of the silicon nitride film to be formed and an amount of the silicon nitride film to be etched back are set to allow the silicon nitride film-based sidewall 332 remaining on the gate to accurately cover the gate. A portion of the gate covered by the silicon nitride film-based sidewall will be protected during etching for the gate in a subsequent step, so that the gate electrode is formed to have a desired film thickness, in a self-alignment manner.

As shown in FIGS. 24(a) and 24(b), the silicon oxide film 331 remaining on the metal gate is removed by wet etching.

As shown in FIGS. 25(a) and 25(b), a pattern for a gate line is formed by lithography using a resist or multilayer resist.

As shown in FIGS. 26(a) and 26(b), the gate conductive film and the gate dielectric film are partially removed by etching using the resist 333 as a mask. Consequently, a gate line (318a to 318d) is formed.

As shown in FIGS. 27(a) and 27(b), the silicon nitride film-based mask 319 and the silicon nitride film-based sidewall 332 are removed by wet etching.

As shown in FIGS. 28(a) and 28(b), a silicon nitride film 334 is formed as a spacer.

As shown in FIGS. 29(a) and 29(b), the silicon nitride film is etched back to form a structure where a sidewall of an upper portion of the pillar-shaped silicon layer and a sidewall of the gate electrode are covered by the silicon nitride film-based spacer 334. This structure allows the gate dielectric film 317 to be covered by the silicon nitride film 334, so as to prevent the gate dielectric film 317 from being damaged by wet treatment and impurity implantation in subsequent steps.

In addition, the silicon nitride film-based spacer 334 covering the respective sidewalls of the pillar-shaped silicon layer and the gate electrode can prevent the occurrence of short-circuiting between the drain and the source and between the source and the gate due to the silicide layers.

As shown in FIGS. 30(a) and 30(b), an impurity is introduced into each of the N+ implantation zones and the P+ implantation zone, by ion implantation or the like, to form a source diffusion layer (314, 316) in an upper portion of the pillar-shaped silicon layer.

As shown in FIGS. 31(a) and 31(b), each of the drain and source diffusion layers is selectively silicided through sputtering of a metal, such as Co or Ni, and a heat treatment, to form a silicide layer (313a, 313b) in an upper surface of the drain diffusion layer, and a silicide layer 315 in an upper surface of the source diffusion layer in the upper portion of the pillar-shaped silicon layer.

As shown in FIGS. 32(a) and 32(b), the silicon nitride film-based spacer 334 on the respective sidewalls of the pillar-shaped silicon layer and the gate electrode are removed by wet etching or dry etching.

As shown in FIGS. 33(a) and 33(b), a contact-stopper silicon nitride film 335 is formed.

As shown in FIGS. 34(a) and 34(b), a silicon oxide film is formed to serve as an interlayer film, and then a contact (306a to 310a, 306b to 310b) is formed.

Figure 35:
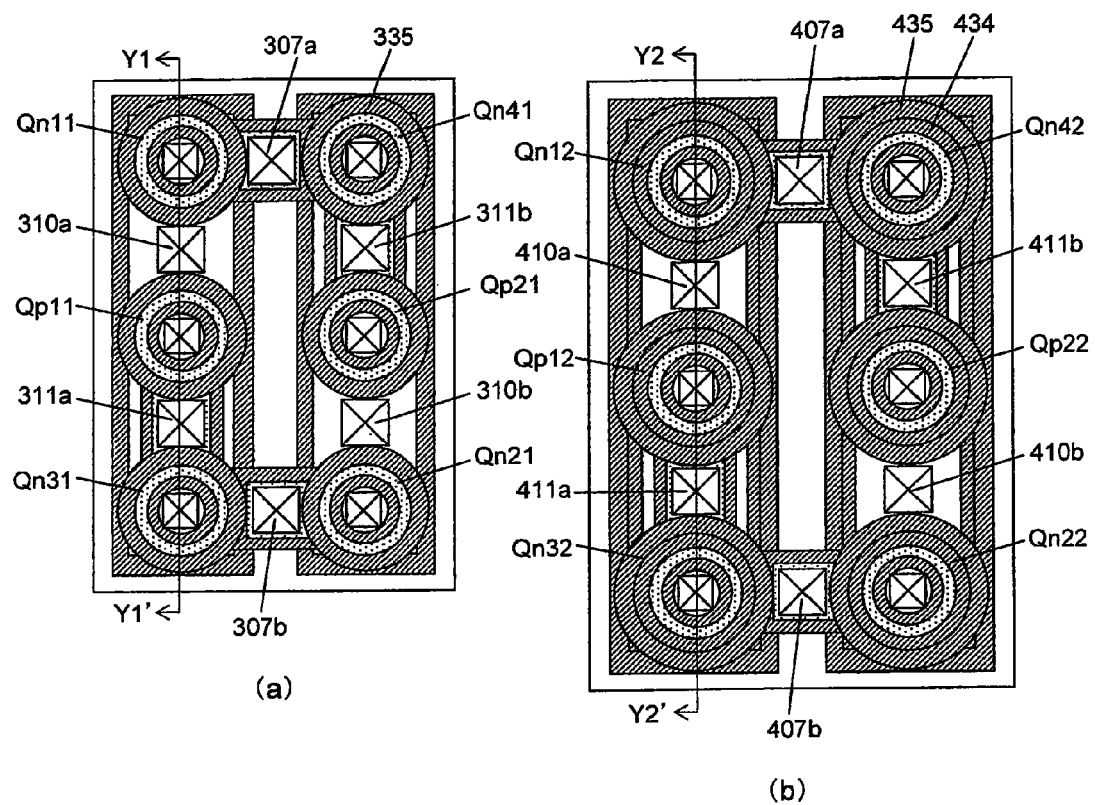
FIGS. 35(a) and 35(b) are top plan views showing the SRAM according to the third embodiment and a conventional SRAM, respectively.
Figure 36:
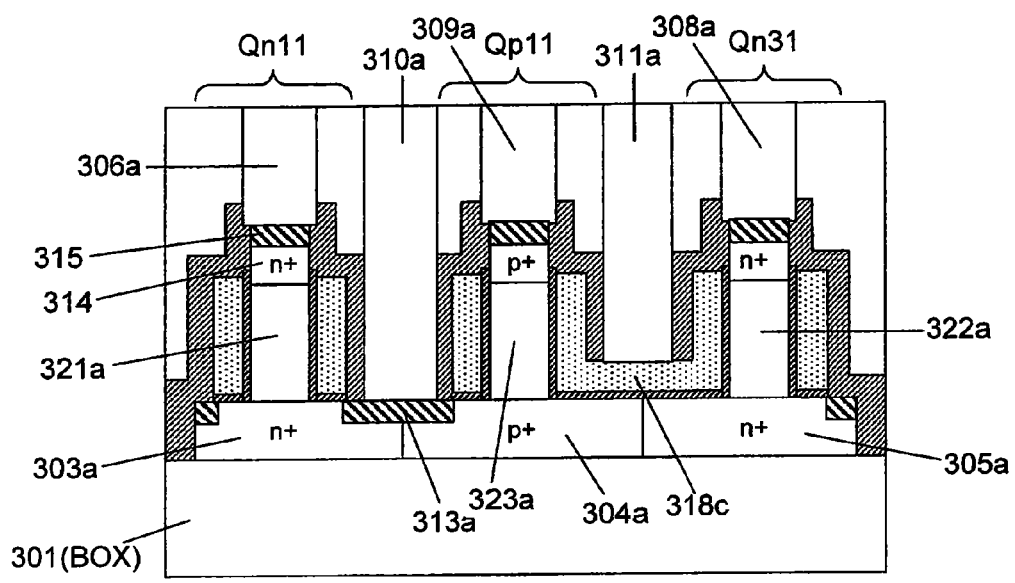
FIGS. 36(a) and 36(b) are sectional views showing the SRAM according to the third embodiment and the conventional SRAM, respectively.
Figure 36:
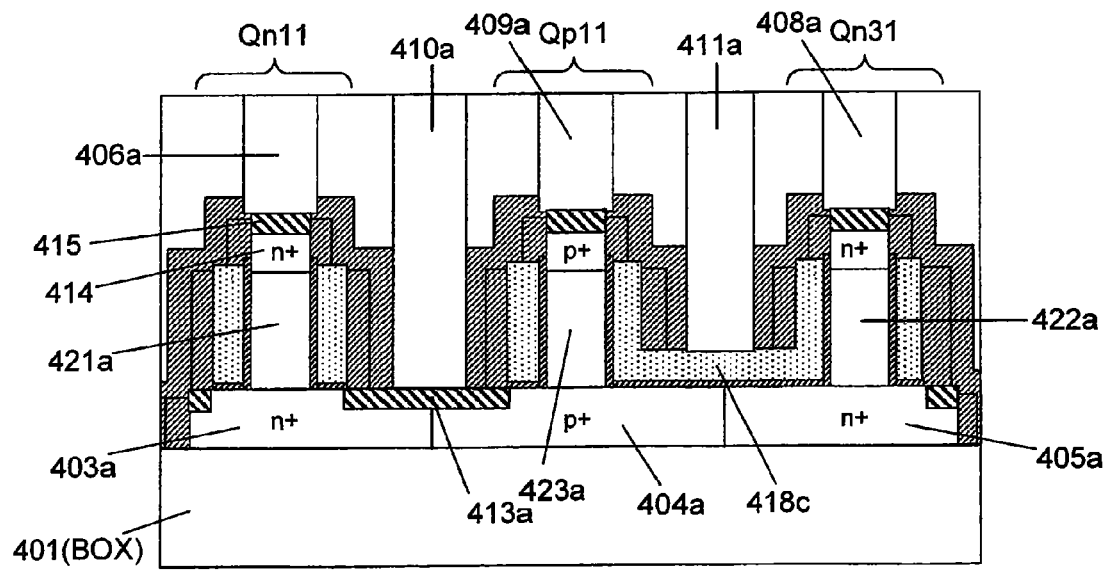
Figure 37:
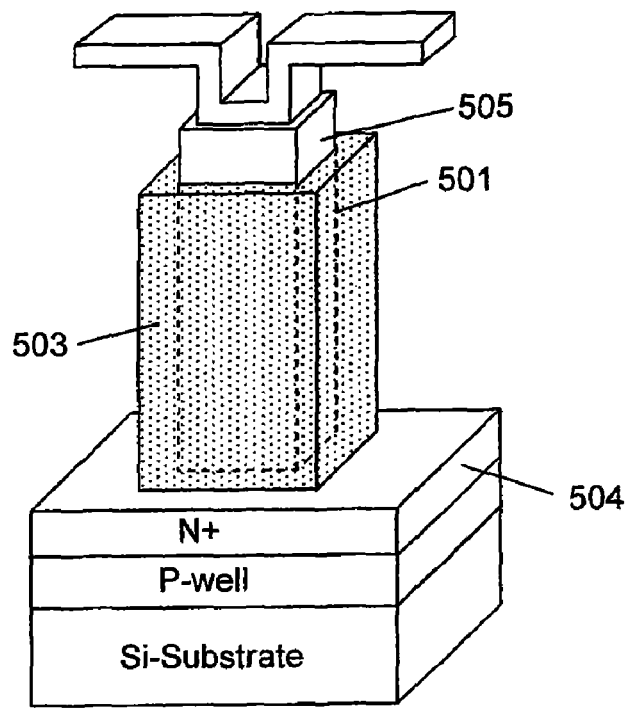
FIGS. 37(a) and 37(b) are, respectively, a bird's-eye view and a sectional view showing one example of a conventional SGT.
Figure 37:
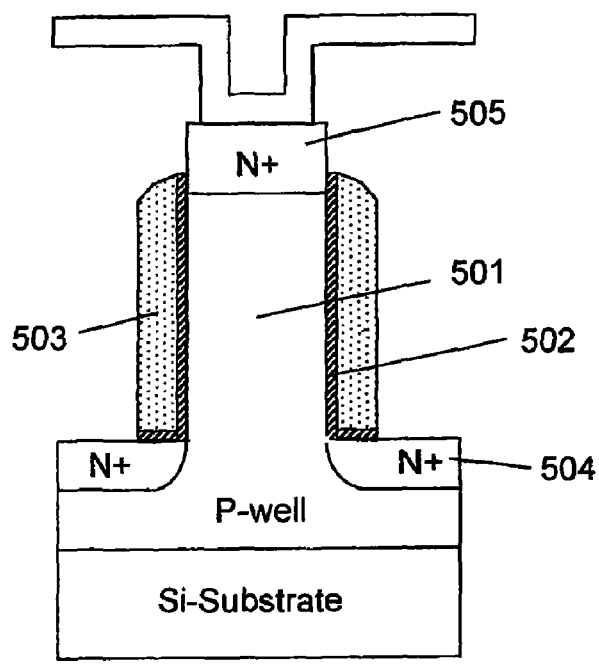

FIG. 35(a) shows a SRAM cell using an SGT according to the present invention (inventive SRAM cell), and FIG. 35(b) a SRAM cell using a conventional SGT (conventional SRAM cell). In FIG. 35(a), a nitride film covering a gate electrode formed around a pillar-shaped silicon layer consists only of a contact-stopper silicon nitride film 335. Differently, in FIG. 35(b), a nitride film covering a gate electrode formed around a pillar-shaped silicon layer has a laminated structure of a silicon nitride film-based spacer 434 formed before silicide formation, and a contact-stopper silicon nitride film 435.

In an SRAM cell, a plurality of pillar-shaped silicon layer and a plurality of contacts are arranged at the shortest intervals in a column direction. Thus, comporting the inventive SRAM cell with the conventional SRAM cell, a distance between the pillar-shaped silicon layer and the contact in the inventive SRAM cell can be reduced by a thickness of the silicon nitride film-based spacer.

In a memory cell of a CMOS 6T-SRAM, there are four positions where a pillar-shaped silicon layer and a contact are arranged with the shortest distance therebetween in a column direction. Specifically, in FIG. 35(a), a contact 310a and each of two pillar-shaped silicon layers Qn11, Qp11 are arranged with the shortest distance therebetween, and a contact 311a and each of two pillar-shaped silicon layers Qp11, Qn31 are arranged with the shortest distance therebetween. Further, there are two positions where a pillar-shaped silicon layer and a contact are arranged with the shortest distance therebetween in a row direction of the SRAM cell. Specifically, in FIG. 35(a), a contact 307a and each of two pillar-shaped silicon layers Qn11, Qn41 are arranged with the shortest distance therebetween, Given that the thickness of the silicon nitride film-based spacer is 30 nm as with the first embodiment, the shortest distance between a pillar-shaped silicon layer and a contact in the inventive SRAM cell is reduced by 30 nm. Thus, a length of the inventive SRAM cell in the column direction is reduced by 30 nm×4=120 nm. Given that a diameter of a pillar-shaped silicon layer, a film thickness of a gate, a size of a contact, and a width of an element isolation region, are, respectively, 30 nm, 50 nm, 60 nm, and 60 nm. In this case, it can be estimated that a length of the conventional SRAM cell in the column direction is about 840 nm. Thus, according to the present invention, the length of the conventional SRAM cell in the column direction can be shrunk by about 14%.

Further, there are two positions where a pillar-shaped silicon layer and a contact are arranged with the shortest distance therebetween in the row direction, as mentioned above. Thus, a length of the inventive SRAM cell in the row direction is reduced by 30 nm×2=60 nm. Given that a diameter of a pillar-shaped silicon layer, a film thickness of a gate, a size of a contact, and a width of an element isolation region, are, respectively, 30 nm, 50 nm, 60 nm, and 60 nm. In this case, it can be estimated that a length of the conventional SRAM cell in the row direction is about 560 nm. Thus, according to the present invention, the length of the conventional SRAM cell in the row direction can be shrunk by about 11%.

Based on the above assumptions, an area of each of the inventive SRAM cell and the conventional SRAM cell can be estimated as follows:

Inventive SRAM cell: 690 nm×420 nm=0.29 $\mu m^2$
Conventional SRAM cell: 810 nm×480 nm=0.39 $\mu m^2$ Thus, according to the present invention, the area of the conventional SRAM cell can be reduced to about 74%.

As described above, in the present invention, a film thickness of a silicon nitride film on an outer periphery of a gate electrode of an SGT can be reduced to allow an occupancy area of a circuit formed using the SGT to be reduced.

What is claimed is:

1. A method of producing a semiconductor device constructed using a MOS transistor which has a structure where a source region and a drain region are formed, respectively, in one and a remaining one of an upper portion and an underneath portion of a pillar-shaped semiconductor layer formed on a silicon substrate, and a gate electrode is formed to surround the pillar-shaped semiconductor layer, the method being characterized by comprising the steps of:

etching a silicon substrate to form a pillar-shaped semiconductor layer;
  forming a gate dielectric film at least on a surface of a sidewall of the pillar-shaped semiconductor layer;
  forming a gate conductive film on a surface of the gate dielectric film;
  etching each of the gate dielectric film and the gate conductive film to form a gate electrode;
  forming a first dielectric film on the sidewall of the upper portion of the pillar-shaped semiconductor layer to prevent siliciding the sidewall of the upper portion of the pillar-shaped semiconductor layer when a silicide layer is formed on an exposed portion of each of the source and drain regions formed in the upper and underneath portions of the pillar-shaped semiconductor layer;
  forming a silicide layer on the exposed portion of each of the diffusion layers formed in the upper and underneath portions of the pillar-shaped semiconductor layer;
  after completion of the formation of the silicide layer, removing the first dielectric film;
  forming a second dielectric film on the pillar-shaped semiconductor layer and the gate electrode to serve as a contact stopper; and
  forming a third dielectric film on the second dielectric film to serve as an interlayer film.

2. The method as defined in claim 1, wherein the first dielectric film comprises any one of a silicon oxide film, a silicon nitride film or a stacked layer consisting of the silicon oxide film and the silicon nitride film.

3. The method as defined in claim 1, wherein the second dielectric film comprises a silicon nitride film and the third dielectric film comprises a silicon oxide film.

4. The method as defined in claim 2, wherein the second dielectric film comprises a silicon nitride film and the third dielectric film comprises a silicon oxide film.

* * * * *